(12) United States Patent
Takemura

(10) Patent No.: US 10,229,913 B2
(45) Date of Patent: Mar. 12, 2019

(54) LOOKUP TABLE AND PROGRAMMABLE LOGIC DEVICE INCLUDING LOOKUP TABLE

(71) Applicant: Semiconductor Energy Laboratory Co., Ltd., Atsugi-shi, Kanagawa-ken (JP)

(72) Inventor: Yasuhiko Takemura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 11 days.

(21) Appl. No.: 15/412,236

(22) Filed: Jan. 23, 2017

(65) Prior Publication Data
US 2017/0133381 A1    May 11, 2017

Related U.S. Application Data

(62) Division of application No. 13/895,852, filed on May 16, 2013, now Pat. No. 9,571,103.

(30) Foreign Application Priority Data

May 25, 2012 (JP) ................................ 2012-119309

(51) Int. Cl.
  *H01L 27/105* (2006.01)
  *H01L 27/092* (2006.01)
  (Continued)

(52) U.S. Cl.
  CPC .......... *H01L 27/1052* (2013.01); *G11C 11/40* (2013.01); *H01L 27/092* (2013.01);
  (Continued)

(58) Field of Classification Search
  None
  See application file for complete search history.

(56) References Cited

U.S. PATENT DOCUMENTS 4,609,986 A    9/1986  Hartmann et al.
4,642,487 A    2/1987  Carter
              (Continued)

FOREIGN PATENT DOCUMENTS

EP    1445864 A    8/2004
EP    2887395 A    6/2015
              (Continued)

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

(Continued)

*Primary Examiner* — Seokjin Kim
(74) *Attorney, Agent, or Firm* — Fish & Richardson P.C.

(57) ABSTRACT

A lookup table with low power consumption is provided. The lookup table includes a memory element including a transistor and a capacitor. A drain of the transistor is connected to one electrode of a capacitor and the input of an inverter, and a source is connected to a first wiring. The other electrode of the capacitor is connected to a second wiring. In such a memory element, the potential of the second wiring is complementary to the potential of the first wiring when writing data; accordingly, the potential of the drain of the transistor, i.e., the potential of the input of the inverter can be higher than the high potential of the inverter. Thus, shoot-through current of the inverter at this time can be significantly reduced. As a result, power consumption in a standby state can be significantly reduced.

16 Claims, 15 Drawing Sheets

(51) Int. Cl.
  *H01L 27/12* (2006.01)
  *H01L 29/786* (2006.01)
  *G11C 11/40* (2006.01)

(52) U.S. Cl.
  CPC ........ *H01L 27/124* (2013.01); *H01L 27/1207* (2013.01); *H01L 27/1225* (2013.01); *H01L 27/1255* (2013.01); *H01L 29/7869* (2013.01)

(56) References Cited

U.S. PATENT DOCUMENTS

| | | | |
|---|---|---|---|
| 4,870,302 | A | 9/1989 | Freeman |
| 6,127,702 | A | 10/2000 | Yamazaki et al. |
| 6,342,792 | B1 | 1/2002 | Huang et al. |
| 6,781,865 | B2 | 8/2004 | Ohtsuka et al. |
| 6,845,032 | B2 | 1/2005 | Toyoda et al. |
| 6,943,580 | B2 | 9/2005 | Lewis et al. |
| 6,956,399 | B1 | 10/2005 | Bauer |
| 7,019,557 | B2 | 3/2006 | Madurawe |
| 7,312,632 | B2 | 12/2007 | Lewis et al. |
| 7,323,902 | B2 | 1/2008 | Lewis et al. |
| 7,330,052 | B2 | 2/2008 | Kaptanoglu et al. |
| 7,495,473 | B2 | 2/2009 | McCollum et al. |
| 7,674,650 | B2 | 3/2010 | Akimoto et al. |
| 7,800,401 | B1 | 9/2010 | Lewis et al. |
| 7,924,053 | B1 | 4/2011 | Kaptanoglu et al. |
| 8,217,678 | B1 | 7/2012 | Lewis et al. |
| 8,339,836 | B2 | 12/2012 | Yamazaki et al. |
| 8,362,538 | B2 | 1/2013 | Koyama et al. |
| 8,410,838 | B2 | 4/2013 | Kato et al. |
| 8,531,866 | B2 | 9/2013 | Ikegami et al. |
| 8,547,753 | B2 | 10/2013 | Takemura et al. |
| 8,614,910 | B2 | 12/2013 | Shionoiri |
| 8,618,586 | B2 | 12/2013 | Koyama et al. |
| 8,860,485 | B2 | 10/2014 | Kato et al. |
| 8,922,236 | B2 | 12/2014 | Saito |
| 8,952,723 | B2 | 2/2015 | Aoki et al. |
| 8,975,918 | B2 | 3/2015 | Takemura |
| 9,350,334 | B2 | 5/2016 | Kato et al. |
| 9,407,269 | B2 | 8/2016 | Koyama et al. |
| 2004/0164778 | A1* | 8/2004 | Toyoda ................ G11C 11/22 327/219 |
| 2010/0148171 | A1 | 6/2010 | Hayashi et al. |
| 2011/0175646 | A1* | 7/2011 | Takemura ........ H03K 19/17784 326/44 |
| 2012/0056647 | A1 | 3/2012 | Nagatsuka et al. |
| 2012/0274355 | A1 | 11/2012 | Nishijima |
| 2012/0293200 | A1 | 11/2012 | Takemura |
| 2013/0293262 | A1 | 11/2013 | Takemura |
| 2013/0293266 | A1 | 11/2013 | Takemura |
| 2016/0226471 | A1 | 8/2016 | Kato et al. |
| 2017/0033128 | A1 | 2/2017 | Koyama et al. |

FOREIGN PATENT DOCUMENTS

| | | |
|---|---|---|
| JP | 05-110392 A | 4/1993 |
| JP | 2004-248282 A | 9/2004 |
| JP | 2006-033794 A | 2/2006 |
| JP | 2010-225194 A | 10/2010 |
| JP | 2011-129896 A | 6/2011 |
| JP | 2011-151796 A | 8/2011 |
| JP | 2012-044618 A | 3/2012 |
| JP | 2012-048807 A | 3/2012 |
| JP | 2012-079401 A | 4/2012 |
| WO | WO-2004/059838 | 7/2004 |
| WO | WO-2011/062075 | 5/2011 |
| WO | WO-2011/078373 | 6/2011 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transaction on Electron Devices, Jun. 1, 1994, vol. 41, No. 6, pp. 926-931.

* cited by examiner

LOOKUP TABLE AND PROGRAMMABLE LOGIC DEVICE INCLUDING LOOKUP TABLE

CROSS-REFERENCE TO RELATED APPLICATIONS

This application is a divisional of U.S. application Ser. No. 13/895,852, filed May 16, 2013, now allowed, which claims the benefit of a foreign priority application filed in Japan as Serial No. 2012-119309 on May 25, 2012, both of which are incorporated by reference.

BACKGROUND OF THE INVENTION

1. Field of the Invention

The present invention relates to a programmable logic device. The present invention further relates to a semiconductor device using the programmable logic device, and an electronic device using the semiconductor device.

In this specification and the like, a semiconductor device means all types of devices that can function by utilizing semiconductor characteristics, and a transistor, a semiconductor circuit, and the like are each one form of semiconductor device.

2. Description of the Related Art

Recently, a programmable logic device (PLD) such as a field programmable gate array (FPGA) or a complex programmable logic device (CPLD), in which the logic can be defined and changed by a user after manufacturing, has attracted attention to replace an application specific integrated circuit (ASIC) which is an integrated circuit for a specific use. The PLD has advantages such as reduction in development period and a high degree of flexibility for the change of the design as compared to the ASIC and, for this reason, has started to be incorporated in a variety of electronic devices.

For example, the PLD consists of a plurality of logic blocks and wirings connecting the logic blocks. By changing the function of the logic blocks, the function of the PLD can be changed. The logic block is formed using, for example, a lookup table (LUT) or the like. The LUT has a function of outputting a value corresponding to a pattern of an input value based on the pre-calculated table of the outputs for patterns of a plurality of input values (see Patent Document 1).

The LUT consists of a memory and multiplexers and can change the circuit structure with data stored in the memory. The data stored in this memory of the LUT or a memory that controls connections of the wirings is called configuration data, and the memory where the configuration data is stored is called a configuration memory. By rewriting the configuration data stored in the configuration memory, the circuit structure can be changed to a desired structure. Note that the configuration memory is a generic term for memory that virtually exists in the LUT or a wiring connection circuit as described above and, in some cases, does not exist in one specific place.

REFERENCE

Patent Document

[Patent Document 1] U.S. Pat. No. 7,019,557
[Patent Document 2] Japanese Published Patent Application No. 2012-44618

SUMMARY OF THE INVENTION

An SRAM including two inverters is used as a memory included in a lookup table. Not only when the input of an inverter is in an intermediate state, but also when the input is at a high level or a low level, current flows between a high potential and a low potential of the inverter (the current is so-called shoot-through current). The shoot-through current is significantly increased as a result of miniaturization in recent years. Thus, in the case of using the SRAM as the memory included in a lookup table, a significant amount of power is consumed due to the shoot-through current of the inverter even in a standby state.

In view of the above problem, an object of one embodiment of the present invention is to provide a lookup table with low power consumption and a driving method thereof. Another object is to provide a programmable logic device including the lookup table.

The lookup table according to one embodiment of the present invention includes a plurality of multiplexers connected to each other in a binary tree with multiple levels and a plurality of memory elements connected to respective input terminals of the multiplexers in the lowermost level.

The memory elements each include a first transistor, a second transistor, a third transistor, and a capacitor. Further, the memory elements each include a node to which one of a source and a drain of the first transistor and one of a pair of electrodes of the capacitor are connected. The node is connected to a gate of the second transistor and a gate of the third transistor. Note that a gate of the first transistor is connected to a first terminal. The other of the source and the drain of the first transistor is connected to a second terminal. The other of the pair of electrodes of the capacitor is connected to a third terminal.

The off-state current of the first transistor is so small that electric charge accumulated in the capacitor can be held for a necessary period of time. In the first transistor, a channel is formed in, for example, a semiconductor which has a wider band gap and lower intrinsic carrier density than silicon. Such a semiconductor preferably has a band gap twice or more as wide as silicon; for example, an oxide semiconductor such as a gallium oxide, a nitride semiconductor such as a gallium nitride, a silicon carbide, and a gallium arsenide. Note that bulk silicon or thin-film silicon may be used for the first transistor.

In one embodiment of the present invention, an oxide semiconductor is used as the semiconductor including the first transistor.

The oxide semiconductor used for the first transistors is preferably a highly purified oxide semiconductor in which impurities serving as electron donors, such as moisture or hydrogen, are reduced and oxygen vacancies are reduced. The highly purified oxide semiconductor is an i-type (intrinsic) semiconductor or a substantially i-type semiconductor. Therefore, a transistor including the oxide semiconductor has a characteristic of significantly small off-state current. Furthermore, the band gap of the oxide semiconductor is 2 eV or more, preferably 2.5 eV or more, further preferably 3.0 eV or more. With the use of the oxide semiconductor film which is highly purified by sufficiently reducing the concentration of impurities such as moisture or hydrogen and by reducing oxygen vacancies, the off-state current of the transistor can be significantly reduced.

Note that in this specification and the like, off-state current means current flowing between a source and a drain when a transistor is in an off state. In the case of an n-channel transistor (e.g., with a threshold voltage of about 0 V to 2 V), the off-state current means current flowing between a source and a drain when a negative voltage is applied between a gate and the source.

Specifically, the small off-state current of the transistor in which a highly purified oxide semiconductor is used for a channel formation region can be demonstrated in various experiments. For example, even when an element has a channel width of $1\times10^6$ µm and a channel length of 10 µm, off-state current can be less than or equal to the measurement limit of a semiconductor parameter analyzer, i.e., less than or equal to $1\times10^{-13}$ A, at voltage (drain voltage) between a source and a drain of from 1 V to 10 V. It can be found that, in this case, an off-state current density corresponding to a value obtained by dividing the off-state current by the channel width of the transistor is less than or equal to 100 zA/µm. In addition, a capacitor and a transistor were connected to each other and the off-state current density was measured by using a circuit in which electric charge flowing into or from the capacitor was controlled by the transistor. In the measurement, the highly-purified oxide semiconductor film was used as a channel formation region in the transistor, and the off-state current density of the transistor was measured from change in the amount of electric charge of the capacitor per unit time. As a result, it was found that, in the case where the voltage between the source and the drain of the transistor is 3 V, a smaller off-state current density of several tens of yA/µm was obtained. Consequently, it can be said that a transistor whose channel formation region is formed in a highly purified oxide semiconductor film has much smaller off-state current than a transistor formed using silicon.

Therefore, by using a transistor in which a channel is formed in an oxide semiconductor film as the first transistor, the amount of electric charge leaking through the first transistor can be significantly reduced even when the first transistor is turned off after the potential of the node to which one of the source and the drain of the first transistor and one of the pair of electrodes of the capacitor are connected is kept constant.

In each of the second transistor and the third transistor, a channel is formed in a semiconductor such as silicon, for example. The second transistor and the third transistor are an n-channel transistor and a p-channel transistor, respectively. An inverter is formed by the second transistor and the third transistor. A drain of the second transistor is connected to a drain of the third transistor and an output terminal. Thus, the potential of the node is inverted and outputted through the inverter.

A lookup table according to one embodiment of the present invention includes a plurality of memory elements and a plurality of multiplexers each having a first input terminal and a second input terminal. The plurality of multiplexers is connected to each other in a binary tree with multiple levels. Each of the first and the second input terminals of the multiplexers in the lowermost level is connected to the respective memory elements. The memory elements each include a first transistor whose off-state current per 1 µm of the channel width is 100 zA or less, an n-channel second transistor, a p-channel third transistor, and a capacitor. One of a source and a drain of the first transistor is connected to one of a pair of electrodes of the capacitor, a gate of the second transistor, and a gate of the third transistor. A drain of the second transistor is connected to a drain of the third transistor. The potential of one of the pair of electrodes of the capacitor is a potential at which the second transistor or the third transistor is turned on by the capacitive coupling with the other of the pair of electrodes of the capacitor.

In the above structure, the maximum value of the potential difference between the gate of the third transistor and the source of the second transistor is preferably larger than the potential difference between the source of the third transistor and the source of the second transistor.

In the above structure, the channel length of the second transistor is preferably twice or more the channel length of the third transistor.

The lookup table according to one embodiment of the present invention may include at least one inverter in the binary tree with multiple levels of the plurality of multiplexers.

A programmable logic device including a plurality of logic blocks each including the above-described lookup table can be provided.

A memory element including a transistor with small off-state current, an inverter, and a capacitor is used as a memory included in a lookup table; thus, power consumed by the lookup table can be reduced. Further, power consumption in a programmable logic device including such a lookup table can be reduced.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Embodiment 1

In this embodiment, one mode of a programmable logic device according to one embodiment of the present invention will be described with reference to FIGS. 1A and 1B, FIG. 2, FIG. 3, FIGS. 4A and 4B, FIG. 5, FIG. 6, and FIG. 7.

Figure 1A:
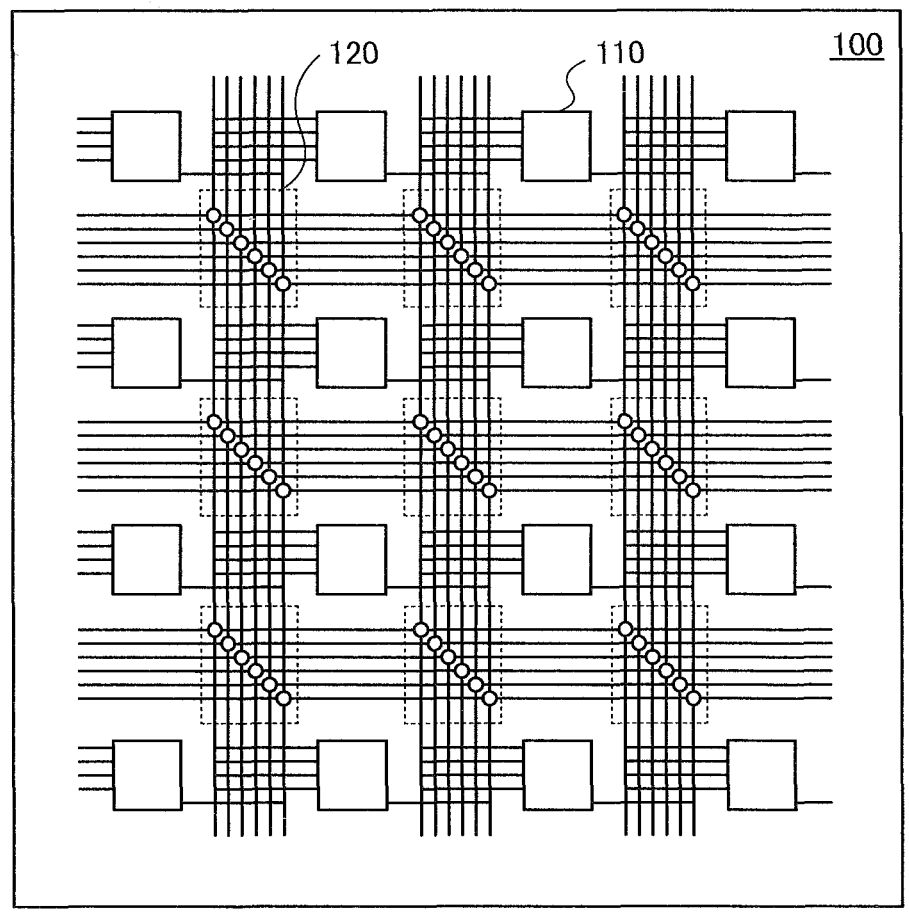
FIGS. 1A and 1B are block diagrams of a programmable logic device.

FIG. 1A is a block diagram of one mode of a programmable logic device 100. The programmable logic device 100 includes a plurality of logic blocks 110 and a plurality of switch blocks 120. The plurality of logic blocks 110 are arranged in a matrix. Wirings are connected to the logic blocks 110. The switch blocks 120 are provided at intersections of a plurality of wirings and a plurality of wirings.

Further, the programmable logic device 100 may include a multiplier, a RAM block, a PLL block, or an I/O element. The multiplier has a function of multiplying plural pieces of data at high speed. The RAM block has a function of storing given data as a memory. The PLL block has a function of supplying a clock signal to a circuit in the programmable logic device 100. The I/O element has a function of controlling signal passing between the programmable logic device 100 and an external circuit.

A memory (not shown) in which configuration data for controlling the programmable logic device 100 is stored is provided outside the programmable logic device 100. The memory is a non-volatile memory such as a flash ROM.

Figure 1B:
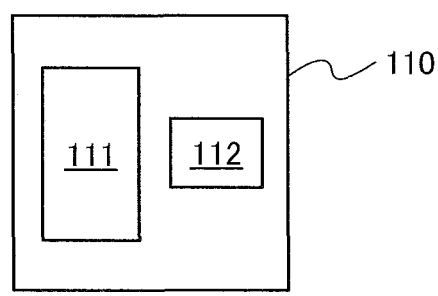

The logic blocks 110 illustrated in FIG. 1B includes a lookup table 111 and a register 112. The configuration data which is stored in the memory provided outside the programmable logic device 100 is inputted in advance to the lookup table 111 and accordingly logic in accordance with the data can be configured. An output signal of the lookup table 111 and a clock signal (CLK) are input to the register 112. The register 112 outputs a signal corresponding to the output signal of the lookup table 111 in synchronization with the clock signal (CLK). The logic block 110 may include a multiplexer which selects the output signal of the lookup table 111 or the output signal of the register 112, or the like. In addition, the logic block 110 may include another lookup table or another register.

The configuration data stored in the memory which is provided outside the programmable logic device 100 is inputted in advance to the switch blocks 120. Electrical connections between the logic blocks 110 or between the logic blocks 110 and a circuit (e.g., a multiplier, a RAM block, a PLL block, an I/O element, or the like) are determined in accordance with the configuration data. Processing, for example, for transferring the configuration data to the logic blocks 110 and the circuit may be performed using an arithmetic processing unit such as a micro processing unit (MPU).

It is possible to omit the register 112 from the logic block 110 illustrated in FIG. 1B. The output of the lookup table 111 can be used as the output of the logic block 110 without the register 112.

Note that all the plurality of logic blocks 110 do not need have the same structure, and the types of the logic blocks 110 may be different. For example, in the structure of the programmable logic device 100 shown in FIG. 1A, both the logic block 110 including the register 112 and the logic block 110 without the register 112 may be present together.

In the programmable logic device 100, configuration data is transferred to a memory in the lookup table 111 which is included in each of the logic blocks 110 from the outside memory. Function of each of the logic blocks 110 is determined in accordance with the configuration data stored in the memory. Further, by rewriting the configuration data stored in the memory in the lookup table, the function of each of the logic blocks 110 can be changed as appropriate.

Note that the connection between the logic blocks 110 can be also changed as appropriate in accordance with the configuration data.

Figure 2:
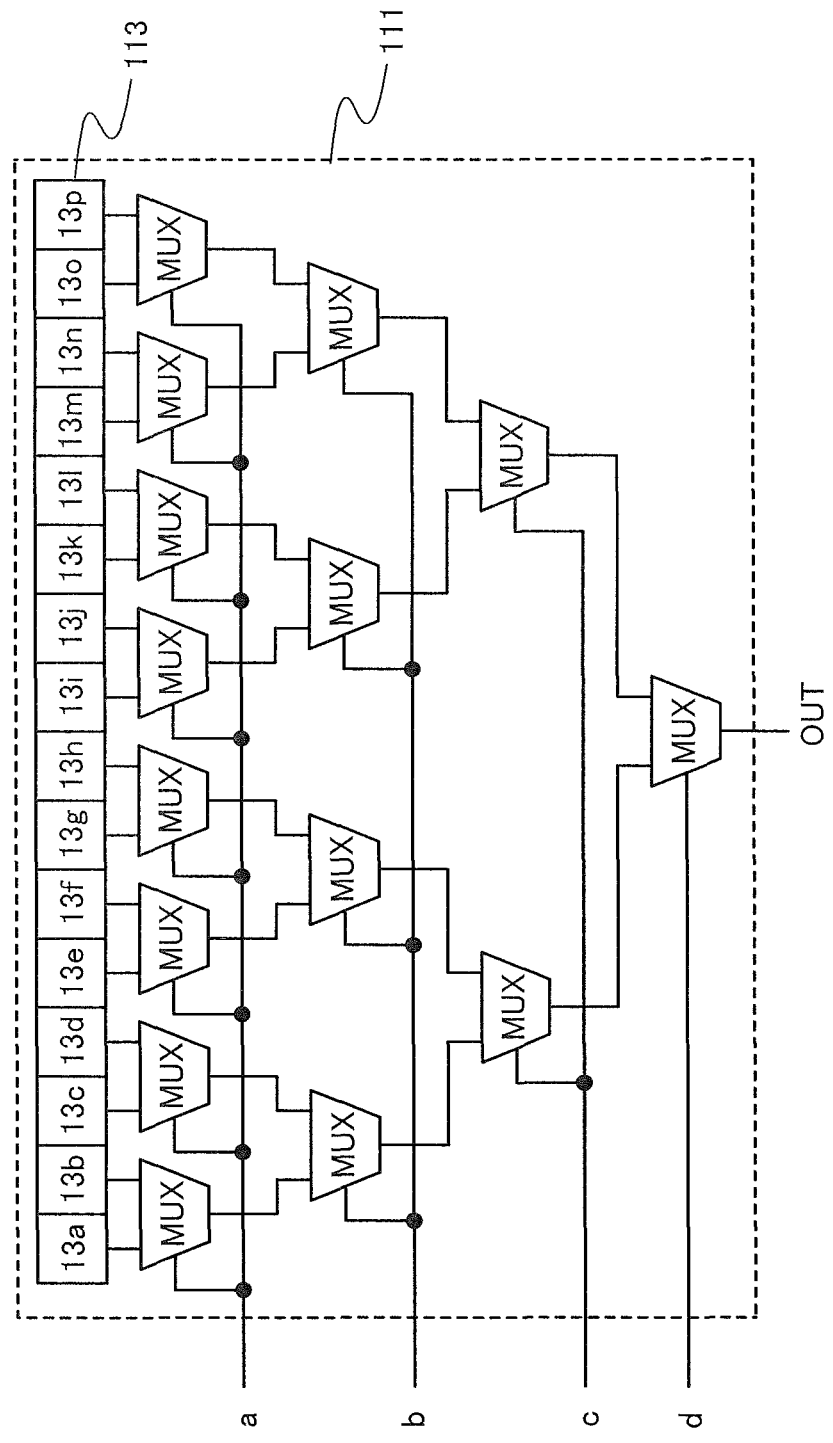
FIG. 2 illustrates a lookup table.

FIG. 2 illustrates one mode of the lookup table 111 included in the logic block 110.

The lookup table 111 illustrated in FIG. 2 is a 4-input 1-output lookup table and includes a memory 113 and a plurality of multiplexers MUXs.

In the lookup table 111, the memory 113 includes a plurality of memory elements 13a to 13p.

In the lookup table 111, the plurality of multiplexers MUXs is each 2-input multiplexer and is connected in a binary tree with multiple levels. Each input terminal of the multiplexers MUXs in the lowermost level is electrically connected to respective memory elements 13a to 13p. The configuration data transferred from the external memory is stored in the memory elements 13a to 13p, and a signal in accordance with the data is inputted to the input terminals of the multiplexers MUXs. Further, the output of the multiplexer in each level is controlled in accordance with the configuration data inputted to input terminals a to d. Then, an output signal is output from the multiplexer MUX in the uppermost level.

Figure 3:
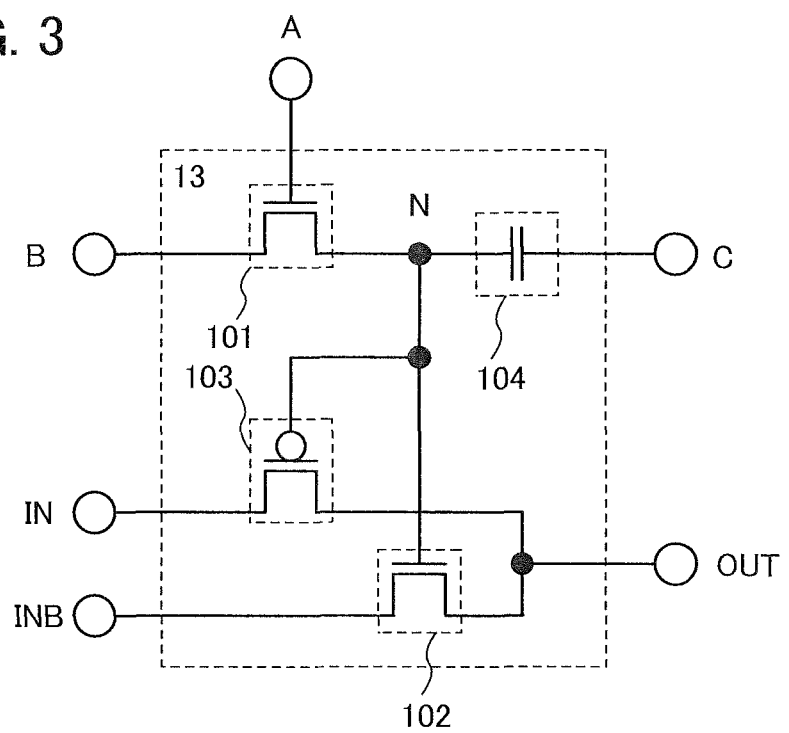
FIG. 3 illustrates a memory element.

FIG. 3 illustrates one mode of the memory element 13 included in the memory 113.

The memory element 13 in FIG. 3 includes a first transistor 101, a second transistor 102, a third transistor 103, and a capacitor 104.

A gate of the first transistor 101 is connected to a terminal A. One of a source and a drain thereof is connected to one of a pair of electrodes of the capacitor 104, a gate of the second transistor 102, and a gate of the third transistor 103. Here, a node to which one of the source and the drain of the first transistor 101 and one of the pair of electrodes of the capacitor 104 are connected is referred to as a node N. The other of the source and the drain of the first transistor 101 is connected to a first wiring. The other of the pair of electrodes of the capacitor 104 is connected to a second wiring. The first wiring is connected to a terminal B. The second wiring is connected to a terminal C.

A drain of the third transistor 103 is connected to a drain of the second transistor 102 and an output terminal OUT. A source thereof is supplied with a potential from an input terminal IN. A source of the second transistor 102 is supplied with a potential from an input terminal INB. A potential complementary to the potential supplied to the input terminal IN is supplied to the input terminal INB.

The first transistor 101 is formed using a transistor having low off-state current. For example, the transistor having low off-state current preferably includes a semiconductor film having a wider band gap than silicon (the band gap of silicon is 1.1 eV) in which a channel is formed. As a semiconductor having a wider band gap than silicon, for example, an oxide semiconductor such as a gallium oxide, a nitride semiconductor such as a gallium nitride, a silicon carbide, a gallium arsenide, and the like can be given. In this embodiment, an oxide semiconductor is used for a semiconductor film of the first transistor 101.

The oxide semiconductor used for the first transistor 101 is preferably a purified oxide semiconductor in which impurities serving as electron donors (donors), such as water or hydrogen, are reduced and oxygen vacancies are reduced. The oxide semiconductor which is highly purified is an i-type (intrinsic) semiconductor or a substantially i-type semiconductor. Therefore, a transistor including the oxide semiconductor has a characteristic of significantly small off-state current. Furthermore, the band gap of the oxide semiconductor is 2 eV or more, preferably 2.5 eV or more, further preferably 3.0 eV or more. With the use of the oxide semiconductor film which is purified by sufficiently reducing the concentration of impurities such as moisture or hydrogen and by reducing oxygen vacancies, the off-state current of the transistor can be significantly reduced.

Specifically, various experiments can prove a small off-state current of a transistor in which a purified oxide semiconductor is used for a channel formation region. For example, even when an element has a channel width of $1 \times 10^6$ mm and a channel length of 10 mm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In this case, it can be found that an off current density corresponding to a value obtained by dividing the off current by the channel width of the transistor is less than or equal to 100 zA/μm. In addition, a capacitor and a transistor were connected to each other and an off current density was measured by using a circuit in which electric charge flowing into or from the capacitor was controlled by the transistor. In the measurement, the highly-purified oxide semiconductor film was used as a channel formation region in the transistor, and the off current density of the transistor was measured from change in the amount of electric charge of the capacitor per unit time. As a result, it has been found that, in the case where the voltage between the source and the drain of the transistor is 3 V, a lower off-state current density of several tens of yA/μm is obtained. Consequently, it can be said that a transistor whose channel formation region is formed in a purified oxide semiconductor film has much smaller off-state current than a transistor including silicon.

Therefore, a transistor in which a channel is formed in an oxide semiconductor film is used as the first transistor 101, so that the amount of electric charge leaking through the first transistor 101 can be significantly reduced even when the first transistor 101 is turned off after a potential of the node N, to which one of the source and the drain of the first transistor 101 and one of the pair of electrodes of the capacitor 104 are connected, is kept constant.

In each of the second transistor 102 and the third transistor 103, a channel is formed in a semiconductor such as silicon, for example. The second transistor 102 and the third transistor 103 are an n-channel transistor and a p-channel transistor, respectively. An inverter is formed by the second transistor 102 and the third transistor 103. Thus, a potential held at the node N is inverted and outputted through the inverter.

Here, assume that data "1" is stored in the memory element 13 when a potential of the output terminal OUT is +1 V, and data "0" is stored in the memory element 13 when a potential of the output terminal OUT is 0 V. When data "0" is stored in the memory element 13, a maximum value of a difference between the gate of the third transistor 103 and the source of the second transistor 102 (0 V in this case) is set higher than a difference between the source of the third transistor 103 (+1 V in this case) and the source of the second transistor 102, preferably, 10% to 100% higher (+1.1 V to +2.0 V in this case). In this manner, the potential of the gate of the third transistor 103 is set higher than the potentials of the source and the drain of the third transistor 103, so that off-state current of the third transistor 103 can be reduced.

Note that in order to prevent latch up caused when the potential of the gate of the third transistor 103 is higher than the potential of the source, the following structure may be employed: one or both of the second transistor 102 and the third transistor 103 is formed using a thin film transistor, and channels of the second transistor 102 and the third transistor 103 are separated from each other by an insulator.

In order to make the potential of the gate of the third transistor 103 (the potential of the node N) the above-described value, the effect of increase in potential by the capacitive coupling can be utilized, for example. In the above-described example, one of the source and the drain of the first transistor 101 is connected to one of the pair of electrodes of the capacitor 104, the gate of the second transistor 102, and the gate of the third transistor 103; and the other of the pair of electrodes of the capacitor 104 is connected to the terminal C. Here, a capacitance of the capacitor 104 is regarded as being equal to a capacitance of the node N (including a gate capacitance of the second transistor 102 and a gate capacitance of the third transistor 103).

Figure 4A:
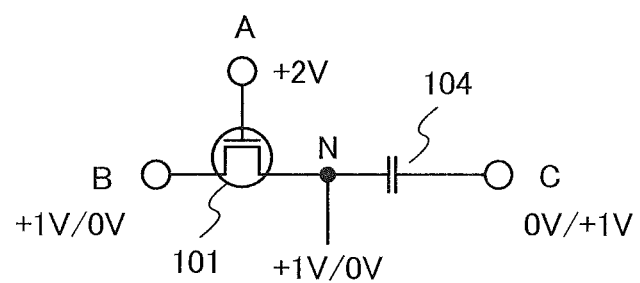
FIGS. 4A and 4B illustrate a lookup table.
Figure 4B:
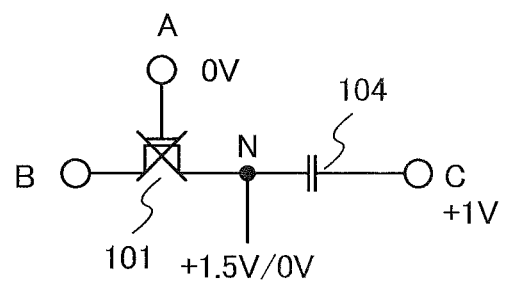

A method for writing data to the memory element 13 is described below with reference to FIGS. 4A and 4B. In this embodiment, threshold voltages of the first transistor 101, the second transistor 102, and the third transistor 103 are +1 V, +0.5 V, -0.5 V, respectively. Note that the second transistor 102 and the third transistor 103 are not illustrated in FIGS. 4A and 4B.

First, a potential of the terminal B (the first wiring) is set to +1 V or 0 V, and a potential of the terminal C (the second wiring) is set to a potential complementary to the potential of the terminal B, e.g., 0 V or +1 V. Then, a potential of the terminal A is set to +2 V to turn on the first transistor 101, and thus the potential of the node N is set to +1 V or 0 V (see FIG. 4A). Note that the complementary potentials are not limited to these. In general, assume that there are two kinds of each possible potential of the terminals B and C, when the potential of the terminal B is the higher of the two, the lower potential of the terminal C is selected. On the contrary, when the potential of the terminal B is the lower of the two, the higher potential of the terminal C is selected.

After that, the potential of the terminal A is set to 0 V to turn off the first transistor 101. Further, the potential of the terminal C is set to +1 V, so that the potential of the node N becomes +1.5 V or 0 V by the capacitive coupling (see FIG. 4B).

Through the above, data writing to the memory element 13 is completed. Note that the potential of the terminal C is kept at +1 V. Since off-state current of the first transistor 101 is small, the potential of the node N can be held for a necessary period (e.g., 10 milliseconds to 10 years). Note that if there is a concern that the potential largely differs from the initial potential, the above-described operation can be repeated in a suitable period.

At this time, the second transistor 102 and the third transistor 103 are in different states depending on the potential of the node N. For example, when the potential of the node N is 0 V, the third transistor 103 is turned on and the potential of the output terminal OUT becomes +1 V (i.e., data "1" is stored). Note that although the second transistor 102 is turned off, the second transistor 102 is not completely insulated, so that current in accordance with the off-state resistance flows from the IN (+1 V) to the INB (0 V). The current is about equal to the general amount of shoot-through current (or crowbar current) of an inverter.

On the other hand, when the potential of the node N is +1.5 V, the third transistor 103 is turned off and the potential of the output terminal OUT becomes 0 V (i.e., data "0" is stored). Since the potential of the node N is higher than the case where the potential of the node N is +1 V, the on-state resistance of the second transistor 102 is accordingly decreased. Note that although the third transistor 103 is turned off, a voltage between the source and the gate is larger than that of the second transistor 102 when the potential of the node N is 0 V; accordingly, the resistance is increased by five or more digits. Accordingly, the amount of current flowing from the IN (+1 V) to the INB (0 V) is extremely smaller than the amount of shoot-through current of a general inverter.

That is, in the above example, power consumption in the case where data "0" is stored in the node N is several orders of magnitude smaller than the case where data "1" is stored in the node N.

In the above example, since one memory element includes one inverter, the amount of shoot-through current can be reduced by half compared to the case where a known SRAM is used as a memory element. In addition, not all data stored in the memory 113 used in the lookup table 111 are "1" and there is data "0" at a certain proportion. Thus, in the case where the memory element 13 is used for the memory 113, the amount of shoot-through current in the whole memory 113 can be reduced by less than half as compared with the case where an SRAM is used as the memory 113.

In general, data of the memory 113 used in the lookup table 111 is biased and the proportion of data "1" is smaller than the proportion of data "0". This phenomenon is not observed in a general memory. In a general memory, the proportions are almost the same. For example, considering the logical function occurring in a 4-input 1-output lookup table, the proportion of data "1" stored in a memory of the lookup table is about 20%, as described later. Thus, in the case where the memory element 13 is used for the memory 113, the amount of shoot-through current in the whole memory 113 can be reduced by about 10% as compared with the case where an SRAM is used as the memory 113.

In this embodiment, since the capacitance of the capacitor 104 is set to be equal to the capacitance of the node N, the potential difference of the node N can be +1.5 V. Similarly, even if the capacitance of the capacitor 104 is less than half of the capacitance of the node N, a sufficient effect can be obtained. For example, if the capacitance of the capacitor 104 is half of the capacitance of the node N, a potential of +1.33 V is obtained. If the capacitance of the capacitor 104 is one third of the capacitance of the node N, a potential of +1.25 V is obtained. If the capacitance of the capacitor 104 is one fourth of the capacitance of the node N, a potential of +1.2 V is obtained. Even if the potential of the node N is +1.2 V, the off-state resistance of the third transistor 103 can be more than 100 times as high as the off-state resistance when the potential of the node N is +1.0 V. Thus, even if the potential of the node N is +1.2 V, the amount of shoot-through current of the inverter in the memory element 13 can be sufficiently reduced.

As described above, since the potential of the node N is +1.5 V, in which case the potential of the node N is higher than the case of +1 V, the on-state resistance of the second transistor 102 is reduced by half. For this reason, the channel length of the second transistor 102 can be twice or more the normal channel length.

In the inverter having such a structure, when the potential of the node N is 0 V (when data "1" is stored), the second transistor 102 is off; however, the channel length is twice the normal and accordingly the off-state resistance is twice or more that of a normal-sized second transistor 102. Further, the long channel length produces an effect of suppressing a short-channel effect, and thus, the off-state resistance of the second transistor 102 is further increased one or more digits.

That is, when data "1" is stored, the amount of shoot-through current can be sufficiently reduced as compared with the case of using a normal-sized transistor.

Note that since the potential of the node N can be increased by the capacitive coupling as described above, the potential of the terminal A can be further increased when writing data. For example, when the potential of the terminal A is +1.8 V, a potential of +0.8 V, that is lower by the threshold value of the first transistor, is written to the node N. Then, the potential of the node N can be increased to +1.2 V by the capacitive coupling. As described above, even when the potential of the node N is +1.2 V, the amount of shoot-through current can be sufficiently suppressed. The potential change of the terminal A is reduced to 1.8 V from 2 V, and thus, the power consumption can be reduced by about 20%.

With use of the memory element 13 described in this embodiment for the memory 113, power consumed by the memory can be reduced as compared with the case of using an SRAM. Therefore, when such a memory 113 is provided in a lookup table, the power consumption of the lookup table can be reduced. In addition, when the lookup table shown in FIG. 2 is provided in the logic block 110 shown in FIGS. 1A and 1B, power consumed by the programmable logic device 100 can be reduced.

Figure 5:
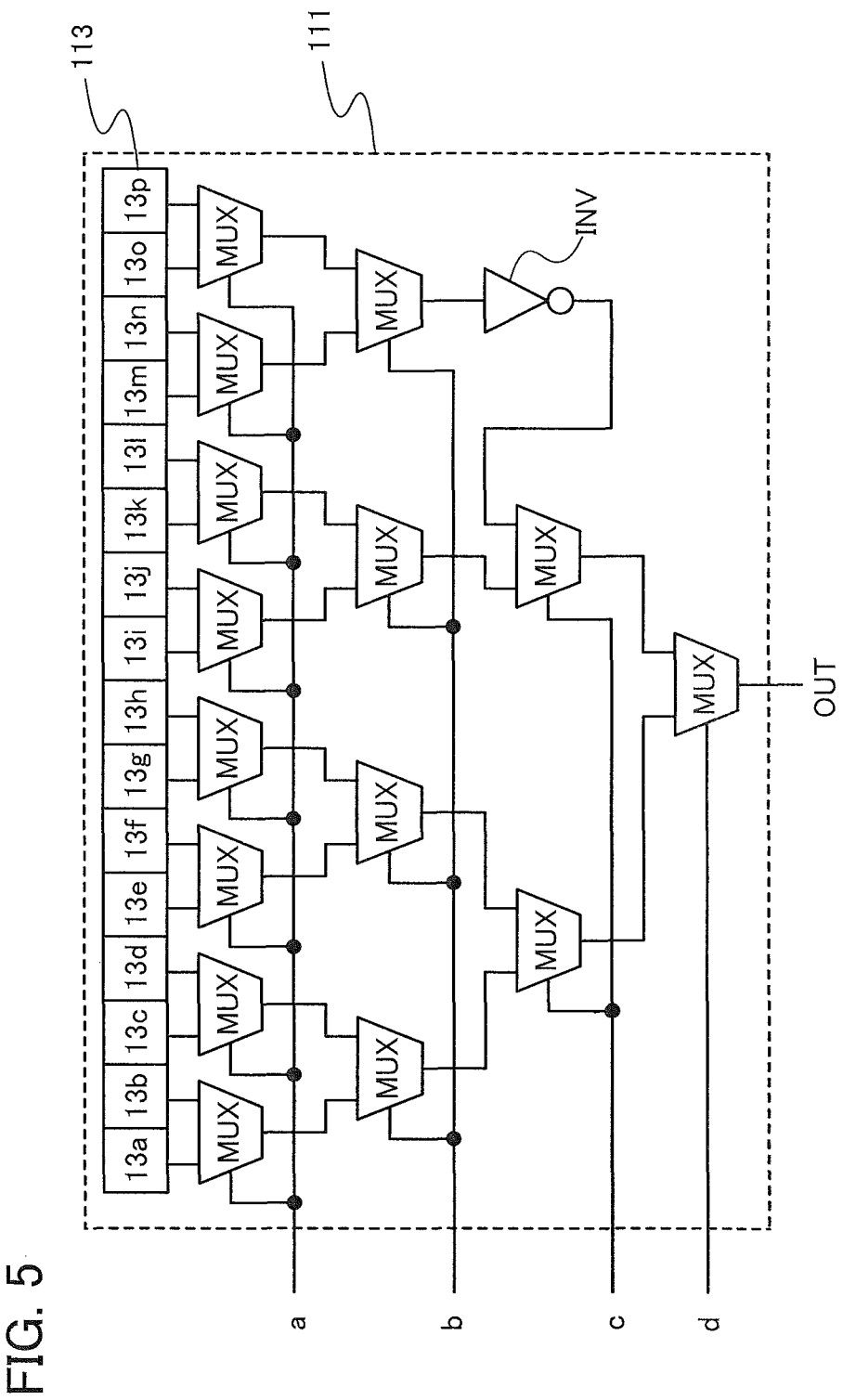
FIG. 5 illustrates a lookup table.

In order to reduce the amount of data "1" stored in the memory 113, a lookup table may have a structure shown in FIG. 5.

A lookup table 111 shown in FIG. 5 includes at least one inverter in a binary tree that consists of a plurality of multiplexers MUXs with multiple levels. FIG. 5 is an example in which an inverter is electrically connected to one output terminal of the multiplexers in one level higher than the lowermost level; however, the position of the inverter is not limited to this example.

In the lookup table 111 shown in FIG. 5, opposite data to the data when not providing an inverter is inputted to the memory elements 13*m* to 13*p* in the memory 113. For example, in FIG. 2, "0", "0", "0", "1", "0", "0", "0", "1", "0", "0", "0", "1", "1", "1", "1", and "1" are stored in the memory elements 13*a*, 13*b*, 13*c*, 13*d*, 13*e*, 13*f*, 13*g*, 13*h*, 13*i*, 13*j*, 13*k*, 13*l*, 13*m*, 13*n*, 13*o*, and 13*p*, respectively. In this case, data "1" is stored in 7 bits in the memory 113.

On the other hand, when at least one inverter is provided in a binary tree that consists of a plurality of multiplexers MUXs as shown in FIG. 5, "0", "0", "0", "1", "0", "0", "0", "1", "0", "0", "0", "1", "0", "0", "0", and "0" are stored in the memory elements 13*a*, 13*b*, 13*c*, 13*d*, 13*e*, 13*f*, 13*g*, 13*h*, 13*i*, 13*j*, 13*k*, 13*l*, 13*m*, 13*n*, 13*o*, and 13*p*, respectively. Thus, data "1" is stored in only 3 bits in the memory 113. Note that a truth table of this case is the same as that of the lookup table shown in FIG. 2.

Thus, by using the lookup table having the structure illustrated in FIG. 5, the proportion of data "0" can be further increased; thus, power consumed by the lookup table can be further reduced as compared with the case of not providing the inverter.

Figure 6:
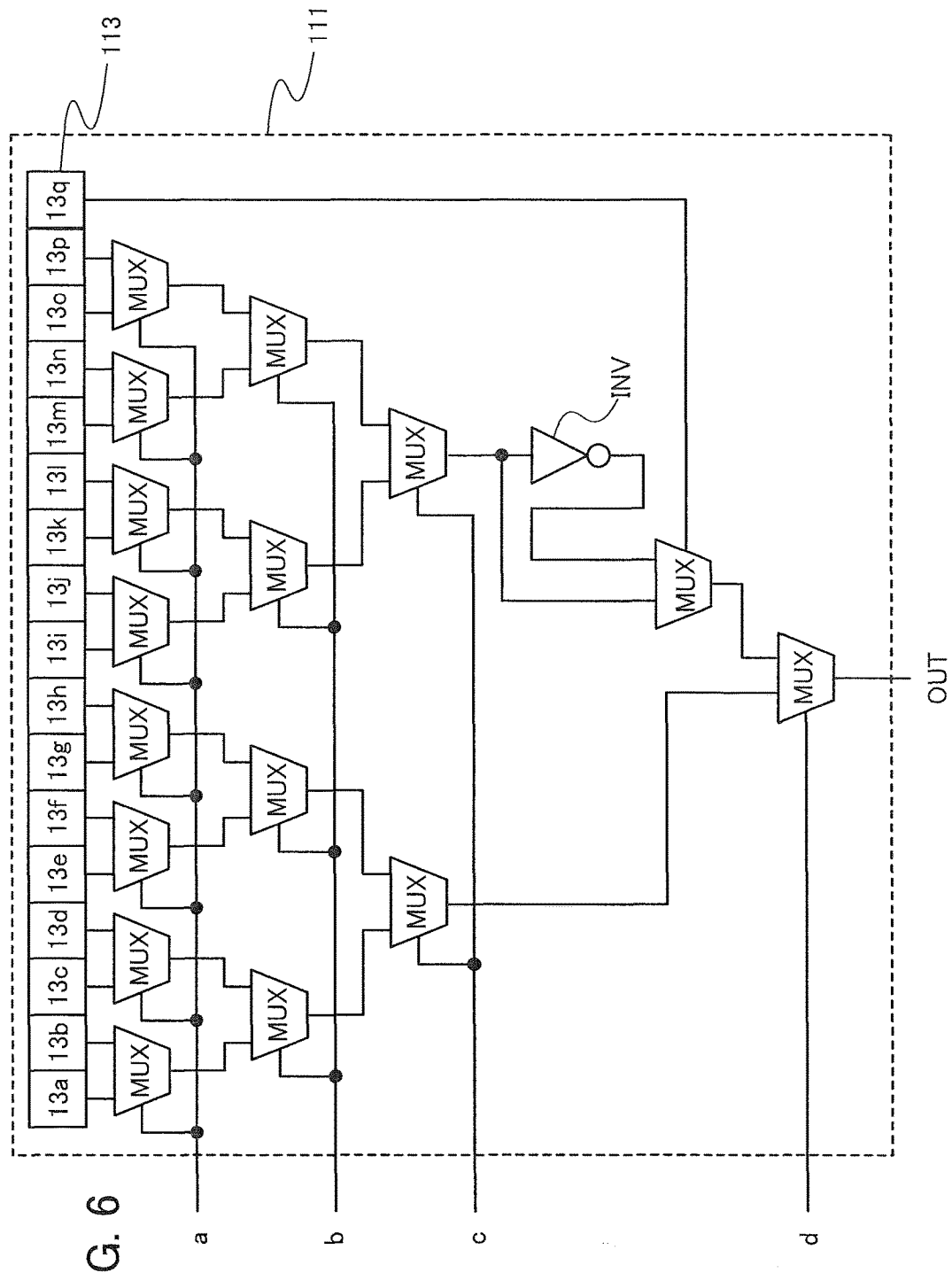
FIG. 6 illustrates a lookup table.

FIG. 6 shows another mode of a lookup table.

In the lookup table shown in FIG. 6, the output of at least one multiplexer MUX among a plurality of multiplexers MUXs are divided into two and one of the divided output is inverted by an inverter INV. Either the inverted signal or the signal that is not inverted is selected by the multiplexer MUX and inputted to a multiplexer MUX in one level higher. The output of the multiplexer MUX to which the inverted signal that is inverted by the inverter INV and the signal that is not inverted by the inverter INV are inputted is selected in accordance with data of a new bit (a memory element 13q) added to the memory 113. The data of the bit (the memory element 13q) added to the memory 113 is also written at the time of configuration in a manner similar to that of the other configuration data (data stored in the memory elements 13a to 13p, and the like). Here, if the data is "1", the output from the inverter is selected; if the data is "0", the output that is not from the inverter is selected.

For example, when the proportion of configuration data "1" is very small, the amount of configuration data "1" in the lookup table in FIG. 5 is equal to that in the lookup table in FIG. 2 or, in some cases, is larger than that in the lookup table in FIG. 2.

In contrast, in the lookup table illustrated in FIG. 6, the inverter INV is inoperative depending on the circumstances, which can reduce the amount of "1" in the configuration data. Note that when the inverter INV is in operation, the amount of "1" in the configuration data is increased by one in some cases.

An example of the effectiveness of the lookup table illustrated in FIG. 6 will be described below.

Statistically, only very limited kinds of logical functions are mostly used in a LUT. According to Patent Document 2, of logical functions that are applied to an input terminal of a 4-input LUT in a FPGA, 27.2% are logical functions A·B·C·D (AND circuits with 4 inputs of A, B, C, and D; the proportion of "1" is 1/16), 17.0% are logical functions A·B·(C+D) (the proportion of "1" is 3/16), 13.7% are logical functions A·(B+C+D) (the proportion of "1" is 7/16), 12.8% are logical functions A·B+C·D (the proportion of "1" is 7/16), 12.0% are logical functions A·(B+C·D) (the proportion of "1" is 5/16), 5.6% are logical functions A·(B·C+notB·D) (the proportion of "1" is 3/16), and 11.7% are the other logical functions. Note that this data is only statistics and the values may vary to a large extent from the above-mentioned values depending on the design of the circuit.

Table 1 shows a truth table of the logical function A·B·C·D, the logical function A·B·(C+D), the logical function A·(B+C+D), the logical function A·B+C·D, the logical function A·(B+C·D), and the logical function A·(B·C+notB·D).

Meanwhile in the lookup table 111 illustrated in FIG. 2 where half the data in the LUT is inverted and inputted, the proportion of "1" is about 27%.

Whereas, in the lookup table illustrated in FIG. 6, it is possible to select whether half the data in the LUT is inverted depending on the logical circuit; thus, the proportion of "1" can be decreased to less than 15%.

Next, an example of a programmable logic device different from that of FIGS. 1A and 1B is described with reference to FIG. 7.

Figure 7:
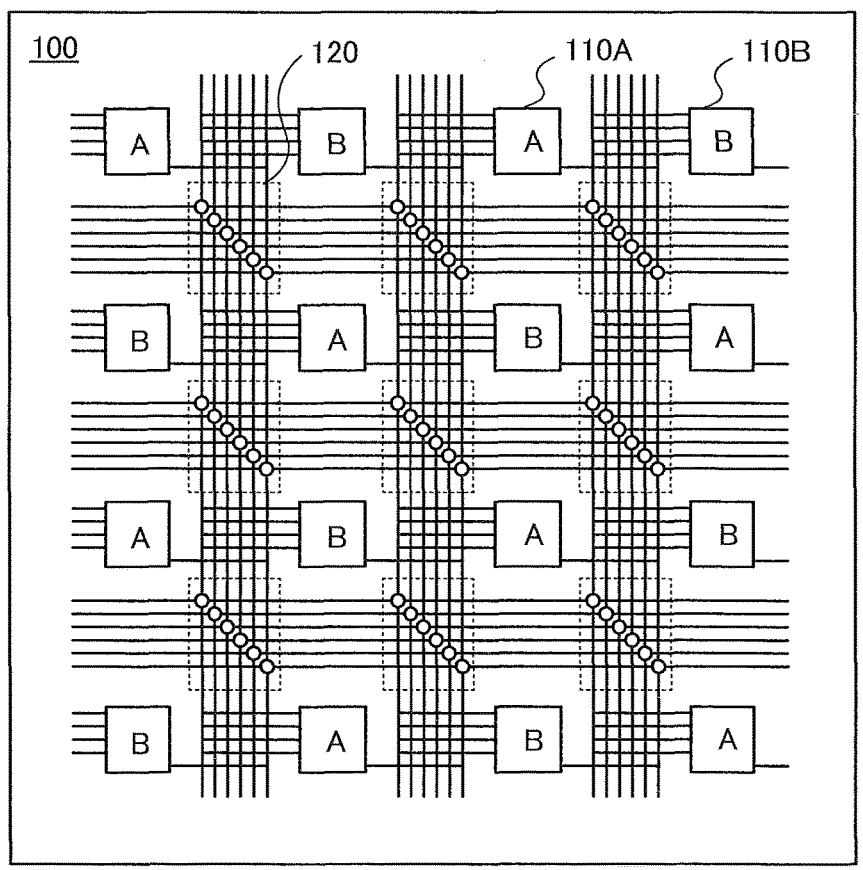
FIG. 7 is a block diagram of a programmable logic device.

In FIG. 7, a plurality of logic blocks 110A and a plurality of logic blocks 110B are provided in a matrix and a plurality of switch blocks 120 and a plurality of wirings are provided to connect the logic blocks. Here, a lookup table including the inverter INV as shown in FIG. 5 is used as each of the logic blocks 110A; a lookup table not including the inverter INV as shown in FIG. 2 is used as each of the logic blocks 110B.

According to Patent Document 2, in a 4-input LUT, the percentage of appearance of the logical functions (A·(B+C+D), A·B+C·D, and A·(B+C·D)) with which the proportion of "1" is decreased in the case of providing an inverter INV in the binary tree including a plurality of multiplexers MUXs as in the lookup table 111 illustrated in FIG. 5 is about 39%. Given that the other logical functions also exist at the same percentages as those in Patent Document 2, the percentage of appearance of the logical functions with which the proportion of "1" is decreased in the case of providing an inverter INV is about 44%.

Accordingly, the logic blocks 110A are used for the logical functions (A·(B+C+D), A·B+C·D, and A·(B+C·D)) and the logic blocks 110B are used for the other logical functions; in this way, effects similar to those in the case of using the lookup table illustrated in FIG. 6 can be obtained. Note that although the logic blocks 110A and the logic blocks 110B are provided in equal proportions in FIG. 7, the proportions thereof may be different from each other. In addition, in the case where a plurality of lookup tables, for example, two types of lookup tables shown in FIG. 2 and FIG. 5, is included in one logic block, the similar effect can be obtained.

TABLE 1

| A | B | C | D | A·B·C·D | A·B·(C+D) | A·(B+C+D) | A·B+C·D | A·(B+C·D) | A·(B·C+notB·D) |
|---|---|---|---|---------|-----------|-----------|---------|-----------|----------------|
| 0 | 0 | 0 | 0 | 0 | 0 | 0 | 0 | 0 | 0 |
| 0 | 0 | 0 | 1 | 0 | 0 | 0 | 0 | 0 | 0 |
| 0 | 0 | 1 | 0 | 0 | 0 | 0 | 0 | 0 | 0 |
| 0 | 0 | 1 | 1 | 0 | 0 | 0 | 1 | 0 | 0 |
| 0 | 1 | 0 | 0 | 0 | 0 | 0 | 0 | 0 | 0 |
| 0 | 1 | 0 | 1 | 0 | 0 | 0 | 0 | 0 | 0 |
| 0 | 1 | 1 | 0 | 0 | 0 | 0 | 0 | 0 | 0 |
| 0 | 1 | 1 | 1 | 0 | 0 | 0 | 1 | 0 | 0 |
| 1 | 0 | 0 | 0 | 0 | 0 | 0 | 0 | 0 | 0 |
| 1 | 0 | 0 | 1 | 0 | 0 | 1 | 0 | 0 | 0 |
| 1 | 0 | 1 | 0 | 0 | 0 | 1 | 0 | 0 | 1 |
| 1 | 0 | 1 | 1 | 0 | 0 | 1 | 1 | 1 | 1 |
| 1 | 1 | 0 | 0 | 0 | 0 | 1 | 1 | 1 | 0 |
| 1 | 1 | 0 | 1 | 0 | 1 | 1 | 1 | 1 | 0 |
| 1 | 1 | 1 | 0 | 0 | 1 | 1 | 1 | 1 | 1 |
| 1 | 1 | 1 | 1 | 1 | 1 | 1 | 1 | 1 | 1 |

Although it is difficult to precisely estimate the proportion of "1" in the other logical functions, given that it is the same as the average proportion of "1" of the top six logical functions (i.e., 21%), the proportion of "1" in the LUT illustrated in FIG. 2 is about 24%.

The memory element described in this embodiment is used as a memory included in a lookup table, and thus, power consumed by the memory can be reduced. Accordingly, power consumed by the lookup table can be reduced.

In addition, at least one inverter is provided in a binary tree that consists of a plurality of multiplexers, and thus, configuration data stored in a memory can be optimized.

Specifically, the proportion of "0" in configuration data stored in a memory can be increased. This can reduce power consumed for transfer of the configuration data. Further, repetition of "0" in the configuration data can reduce power consumed by the programmable logic device as compared with the case where "0" is not repeated.

With use of the memory element 13 described in this embodiment for the memory 113, power consumed by the memory can be reduced as compared with the case of using an SRAM. Therefore, when such a memory 113 is provided in a lookup table, the power consumption of the lookup table can be reduced. In addition, when the lookup table is provided in the logic block shown in FIGS. 1A and 1B and FIG. 7, power consumed by the programmable logic device 100 can be reduced.

In addition, since at least one inverter is provided in a binary tree that consists of a plurality of multiplexers MUXs, the proportion of "0" in configuration data stored in a memory in a lookup table can be increased. This can further reduce power consumed in the lookup table. Further, when the logic block shown in FIGS. 1A and 1B and FIG. 7 includes the lookup table, power consumed by the programmable logic device 100 can be reduced.

Embodiment 2

In this embodiment, a method for manufacturing a semiconductor device will be described. Specifically, a method for manufacturing the memory element 13 described in the above embodiment is described with reference to FIGS. 8A to 8C, FIGS. 9A to 9C, FIGS. 10A to 10C, FIGS. 11A to 11C, FIGS. 12A and 12B, and FIG. 13. Note that FIGS. 8A to 8C, FIGS. 9A to 9C, and FIGS. 10A to 10C illustrate positions and planar shapes of structures such as a main wiring of the memory element, a contact plug, and the like. FIGS. 11A to 11C, FIGS. 12A and 12B, FIG. 13, and FIG. 14 are cross-sectional views illustrating the method for manufacturing the memory element, which are diagrams schematically illustrating cross sections taken along a broken line A-B in FIGS. 8A to 8C, FIGS. 9A to 9C, and FIGS. 10A to 10C.

First, a method for manufacturing a second transistor and a third transistor in the memory element is described. Note that the channel length of the second transistor described in this embodiment is twice the channel length of the third transistor.

First, a substrate containing a semiconductor material is prepared. As the substrate including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. This embodiment describes the case where the n-channel single-crystal silicon substrate is used.

Next, an impurity imparting p-type conductivity is added to the substrate, whereby a p-well region 302 is formed. Here, a region to which the impurity imparting p-type conductivity are not added serves as an n-well region 301 formed in the substrate (see FIG. 8A and FIG. 11A). For example, boron, aluminum, or the like is used as the impurity imparting p-type conductivity.

Next, part of the substrate is removed by selectively etching the substrate. Then, an insulating film is formed over the substrate and is selectively removed, whereby an element isolation insulating layer 303 is formed (see FIG. 8B and FIG. 11B).

The insulating film can be formed using silicon oxide, silicon nitride, silicon nitride oxide, or the like by a CVD method, a sputtering method, or the like. The insulating film can be removed by polishing treatment such as CMP, etching treatment, or the like.

Next, an insulating film is formed over the substrate. Then, a conductive film is formed over the insulating film. After that, the conductive film and the insulating film are selectively removed, whereby a gate electrode layer 305 and a gate insulating layer 304 are formed.

The insulating film can be formed using silicon oxide, silicon oxynitride, silicon nitride, hafnium oxide, aluminum oxide, tantalum oxide, or the like by a CVD method, a sputtering method, or the like. The insulating film may have a single-layer structure or a layered structure. Alternatively, the insulating film can be formed by oxidizing or nitriding the surface of the substrate by high-density plasma treatment or thermal oxidation treatment.

The conductive film can be formed using a metal material such as aluminum, copper, titanium, tantalum, or tungsten. There is no particular limitation on the formation method, and a CVD method, a sputtering method, an evaporation method, a spin coating method, or the like can be employed.

Next, using the gate electrode layer 305 as a mask, $n^+$ regions 306a and 306b (also referred to as a source region and a drain region) and an $n^+$ region 306c are formed by adding impurities imparting n-type conductivity, and further, a $p^+$ region 307a and $p^+$ regions 307b and 307c (also referred to as a source region and a drain region) are formed by adding impurities imparting p-type conductivity.

Here, so-called halo region may be formed on the outer side than the source region and the drain region by adding impurities with relatively high concentration which impart the conductivity type opposite to those of the source region and the drain region. The halo region can suppress not only a short channel effect, but also latch up.

Figure 8A:
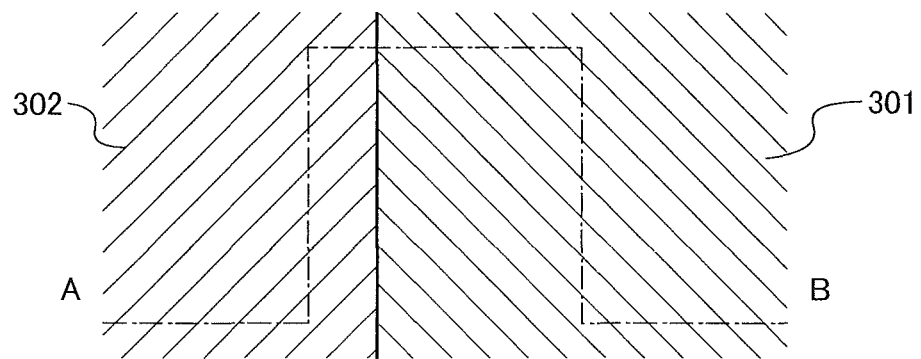
FIGS. 8A to 8C are plan views illustrating a method for manufacturing a semiconductor device.
Figure 8B:
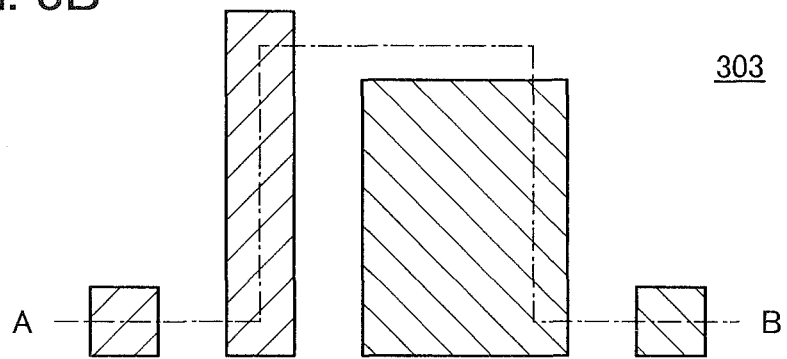
Figure 8C:
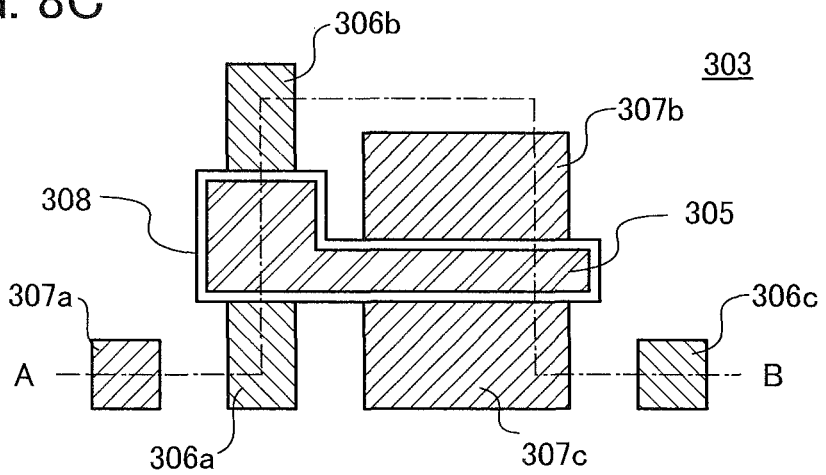
Figure 11A:
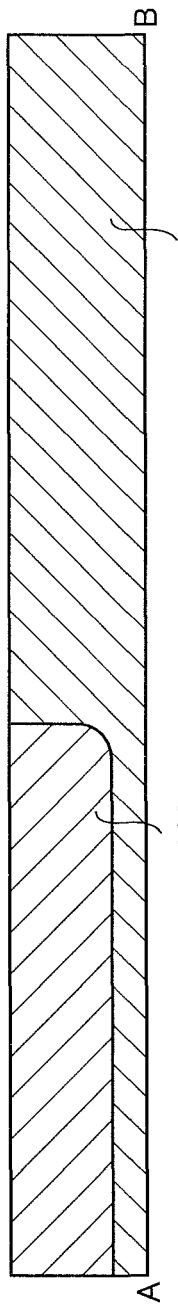
FIGS. 11A to 11C are cross-sectional views illustrating a method for manufacturing a semiconductor device.
Figure 11B:
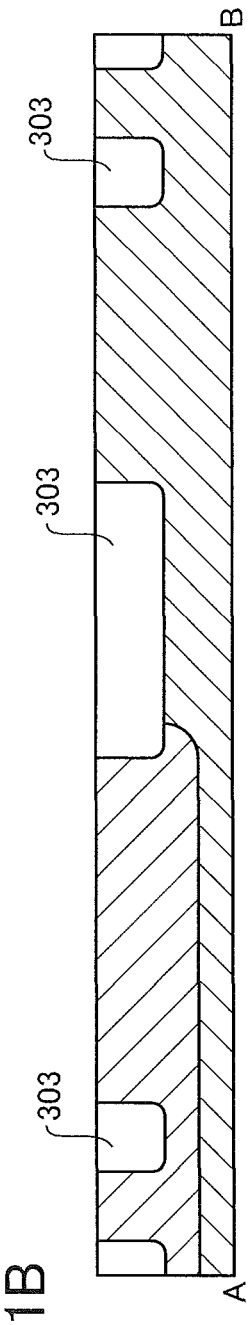
Figure 11C:
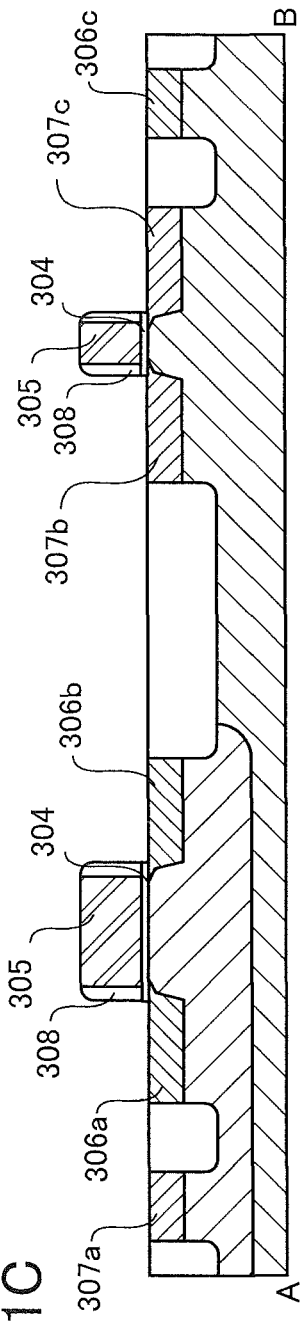

Next, an insulating film is formed over the gate electrode layer 305 and the like and is subjected to highly anisotropic etching treatment, whereby a sidewall insulating layer 308 is formed on the side wall of the gate electrode layer 305 (see FIG. 8C and FIG. 11C).

Next, an insulating film 309 is formed so as to cover the components formed in the above steps. Then, an opening is formed in the insulating film 309, and then, a conductive film is formed in a region including the opening. The conductive film is subjected to polishing or etching treatment, whereby contact plugs 310a to 310g are formed (see FIG. 9A and FIG. 12A).

Figure 9A:
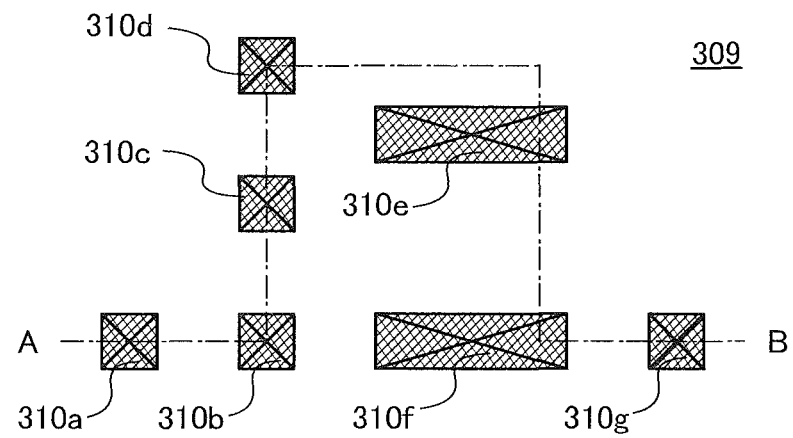
FIGS. 9A to 9C are plan views illustrating a method for manufacturing a semiconductor device.
Figure 9B:
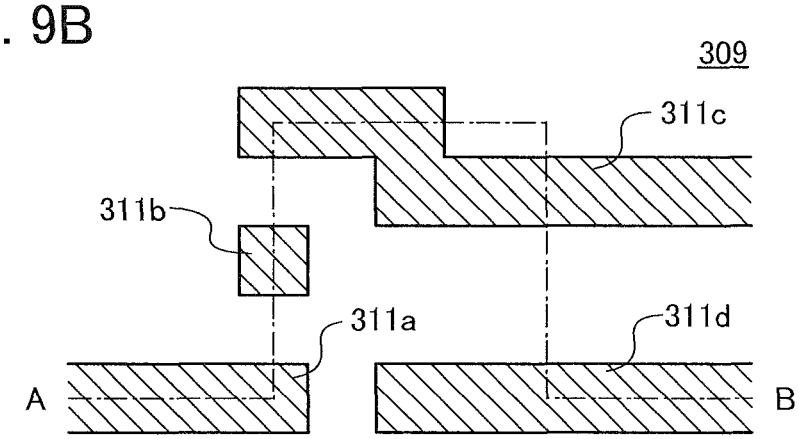
Figure 9C:
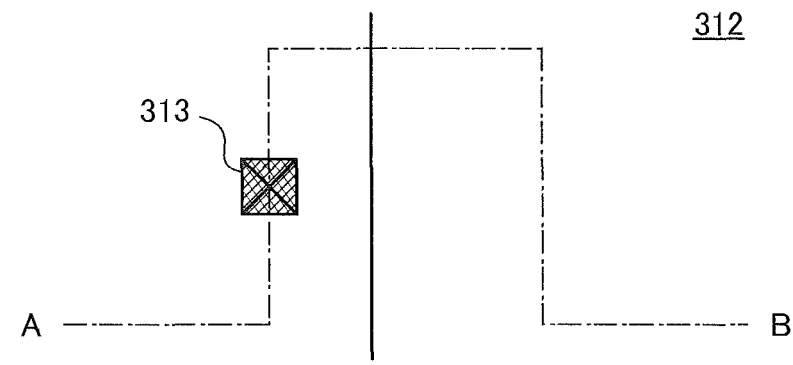
Figure 12A:
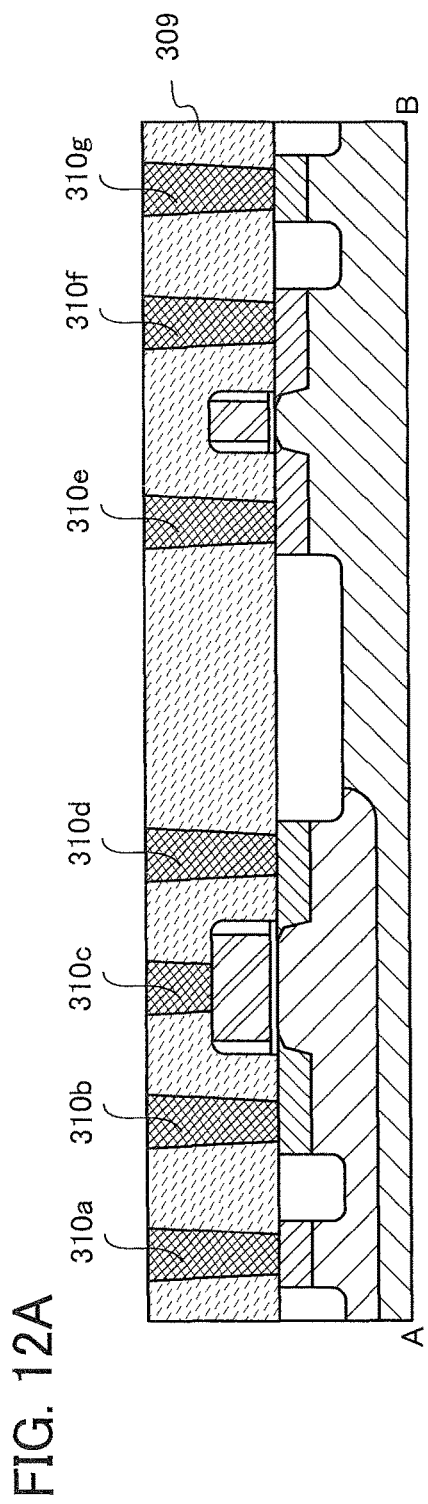
FIGS. 12A and 12B are cross-sectional views illustrating method for manufacturing a semiconductor device.
Figure 12B:
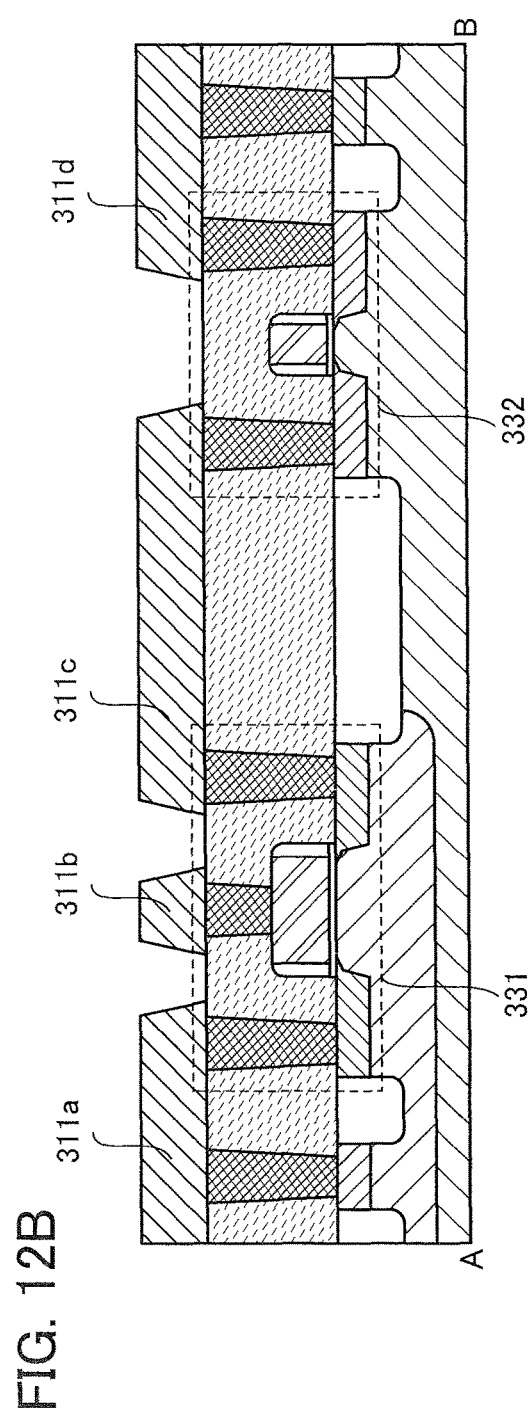

Then, a conductive film is formed over the insulating film 309, the contact plugs 310a to 310g, and the like and is selectively etched, whereby wiring layers 311a to 311d are formed (see FIG. 9B and FIG. 12B).

Through the above steps, an n-channel transistor 331 and a p-channel transistor 332 can be formed. The transistor 331 and the transistor 332 correspond to the transistor 102 and the transistor 103, respectively, which are described in the above embodiment.

Next, an insulating film 312 is formed over the insulating film 309 and the wiring layers 311a to 311d. Then, an opening is formed in the insulating film 312, and a conductive film is formed in a region including the opening. The conductive film is subjected to polishing or etching treatment, whereby a contact plug 313 is formed (see FIG. 9C and FIG. 13).

Then, a conductive film is formed over the insulating film 312 and is selectively etched, whereby wiring layers 314a and 314b are formed. Here, the wiring layers 314a and 314b serve as one of a pair of electrodes of a capacitor and a gate electrode layer of a transistor, respectively (see FIG. 10A and FIG. 13).

The wiring layers 314a and 314b can be formed using a metal material such as molybdenum, titanium, tantalum, tungsten, aluminum, copper, chromium, neodymium, or scandium or an alloy material containing any of these materials as a main component by a sputtering method, a PECVD method, or the like. The wiring layers 314a and 314b can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. Further, a stacked-layer structure of the above conductive material and the above metal material can be used.

Next, an insulating film is formed over the wiring layers 314a and 314b. The insulating film is subjected to polishing or etching treatment, whereby an insulating layer 315 is formed.

The insulating film 315 can be formed by a CVD method or a sputtering method to have a single-layer structure or a stacked-layer structure using an oxide insulator of silicon oxide, silicon oxynitride, aluminum oxide, aluminum oxynitride, hafnium oxide, or gallium oxide; a nitride insulator of silicon nitride, silicon nitride oxide, or aluminum nitride oxide; or a mixed material of these materials.

Then, a gate insulating film 316 is formed over the wiring layers 314a and 314b and the insulating layer 315.

The gate insulating film 316 can be formed using silicon oxide, gallium oxide, aluminum oxide, aluminum oxynitride, silicon oxynitride, silicon nitride oxide, silicon nitride, or the like. In addition, the gate insulating film 316 is formed using a high-k material such as hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)), or lanthanum oxide, so that gate leakage current can be reduced. The gate insulating film 316 can be formed with a single-layer structure or a stacked-layer structure using any of the above materials. The gate insulating film 316 can be formed by a sputtering method, an MBE method, a plasma CVD method, a pulsed laser deposition method, an ALD method, or the like.

Note that when an oxide semiconductor is used for a semiconductor layer formed later, hydrogen, an alkali metal element, an alkaline earth metal, a metal element such as copper, and elements that are not constituent elements of the oxide semiconductor might be impurities. When hydrogen and water are contained in the oxide semiconductor, carriers are generated and thus electrical characteristics of a transistor deteriorate, for example, a shift of the threshold voltage. Similarly, when there are oxygen vacancies in the oxide semiconductor, carries are generated, which leads to deterioration of electrical characteristics of a transistor. Thus, in the process described below, it is preferable to reduce entry of impurities such as hydrogen and water to the oxide semiconductor in order to reduce oxygen vacancies in the oxide semiconductor.

Then, heat treatment may be performed on the gate insulating film 316 and the like. For example, the heat treatment may be performed with a GRTA apparatus at 650° C. for 1 minute to 10 minutes. Alternatively, the heat treatment may be performed with an electric furnace at a temperature higher than or equal to 350° C. and lower than or equal to 500° C. for 30 minutes to 1 hour. By performing the heat treatment, water, hydrogen, and the like contained in the gate insulating film 316 can be removed. Such a heat treatment for removing water and hydrogen is also referred to as dehydration or dehydrogenation treatment.

Next, treatment for adding oxygen (also referred to as oxygen addition treatment or oxygen implantation treatment) may be performed on the gate insulating film 316. With the oxygen addition treatment, an oxygen excess region is formed in the gate insulating film 316.

The oxygen contains at least any of an oxygen radical, ozone, an oxygen atom, and an oxygen ion (an oxygen molecular ion and/or an oxygen cluster ion). By the oxygen addition treatment performed on the dehydrated or dehydrogenated gate insulating film 316, oxygen can be compensated for oxygen that might be released by the above heat treatment (dehydration or dehydrogenation treatment) and an oxygen excess region can be formed.

Addition of oxygen to the gate insulating film 316 can be performed by an ion implantation method, an ion doping method, a plasma immersion ion implantation method, plasma treatment, or the like, for example. Note that as an ion implantation method, a gas cluster ion beam may be used. Oxygen may be added to the entire surface of the substrate at one time or may be added using a linear ion beam, for example. In the case of using the linear ion beam, oxygen can be added to the entire surface of the gate insulating film 316 by moving the substrate or the ion beam (by scanning the substrate with the ion beam). Further, ashing treatment may be employed as the plasma treatment.

As a gas for supplying the oxygen, a gas containing oxygen (O) may be used, for example, an $O_2$ gas, an $N_2O$ gas, a $CO_2$ gas, a CO gas, a $NO_2$ gas, or the like can be used. Note that a rare gas (e.g., an Ar gas) may be contained in an oxygen-containing gas.

Further, in the case where an ion implantation method is used for adding oxygen, the dose of the oxygen is preferably greater than or equal to $1 \times 10^{13}$ ions/cm$^2$ and less than or equal to $5 \times 10^{16}$ ions/cm$^2$. The content of oxygen in the gate insulating film 316 after the oxygen addition treatment preferably exceeds that of the stoichiometric composition of the gate insulating film 316. Note that such a region containing oxygen in excess of the stoichiometric composition needs to exist in at least a part of the gate insulating film 316. The depth at which oxygen is implanted may be adjusted as appropriate by implantation conditions.

The gate insulating film 316 containing excess oxygen, which serves as an oxygen supply source, is provided to be in contact with the oxide semiconductor film which is formed later, and further, heat treatment is performed later. Accordingly, oxygen is released from the gate insulating film 316 and thus can be supplied to the oxide semiconductor film; Consequently, oxygen vacancies in the oxide semiconductor film can be reduced.

Next, the gate insulating film 316 is selectively etched, whereby an opening 317 is formed in the gate insulating film 316.

Figure 10A:
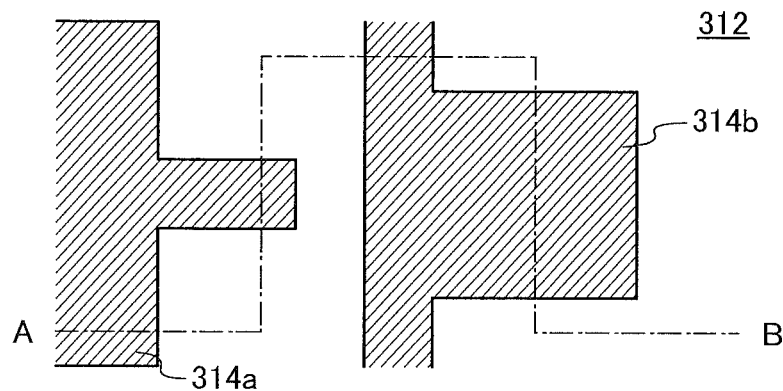
FIGS. 10A to 10C are plan views illustrating a method for manufacturing a semiconductor device.
Figure 10B:
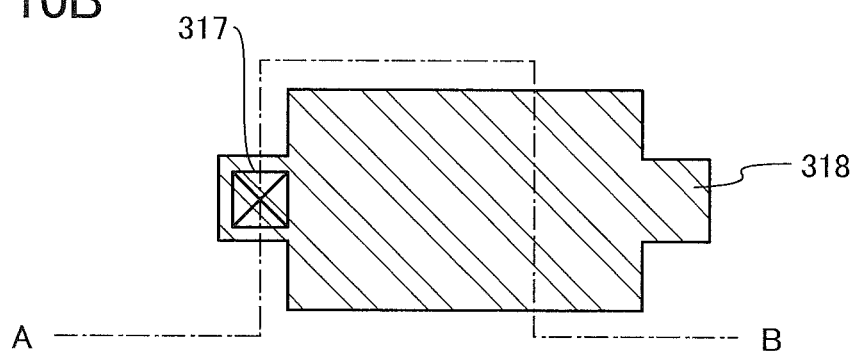

Then, an oxide semiconductor film is formed over the gate insulating film 316 and is selectively etched, whereby an oxide semiconductor film is formed (see FIG. 10B). Here, the wiring layer 314a is in contact with the oxide semiconductor film through the opening 317 formed in the gate insulating film 316.

The oxide semiconductor film can be formed by a sputtering method, a molecular beam epitaxy (MBE) method, a CVD method such as a LPCVD method, a PECVD method, or a mist CVD method, a pulsed laser deposition method, an atomic layer deposition (ALD) method, or the like as appropriate. The thickness of the oxide semiconductor film ranges from 1 nm to 200 nm, preferably from 5 nm to 50 nm.

An oxide semiconductor used for the oxide semiconductor film contains at least indium (In). In particular, indium and zinc (Zn) are preferably contained. The oxide semiconductor preferably contains, in addition to In and/or Zn, gallium (Ga) serving as a stabilizer that reduces variations in electrical characteristics among transistors using the above-described oxide. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: oxides of three metal elements such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; and oxides of four metal elements such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

A structure of an oxide semiconductor film is described below.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having a low impurity concentration. The impurity means an element other than main components of the oxide semiconductor film, such as hydrogen, carbon, silicon, or a transition metal element. In particular, an element (e.g., silicon) having higher strength of bonding to oxygen than a metal element included in the oxide semiconductor film takes oxygen away in the oxide semiconductor film to disrupt the atomic arrangement in the oxide semiconductor film, which causes a lowering of the crystallinity of the oxide semiconductor film. A heavy metal such as iron or nickel, argon, carbon dioxide, or the like has a large atomic radius (or molecular radius), and thus disrupts the atomic arrangement in the oxide semiconductor film when included in the oxide semiconductor film, which causes a lowering of the crystallinity of the oxide semiconductor film. Note that the impurity included in the oxide semiconductor film serves as a carrier trap or a carrier generation source in some cases.

Further, the CAAC-OS film is an oxide semiconductor film having a low density of defect states. For example, in some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, in some cases, a transistor including the oxide semiconductor film rarely has a negative threshold voltage (is rarely normally-on). A highly purified intrinsic or substantially highly purified intrinsic oxide semiconductor film has few carrier traps in some cases. Thus, the transistor including the oxide semiconductor film has a small variation in electrical characteristics and high reliability. Note that a charge trapped by the carrier traps in the oxide semiconductor film takes a long time to be released and may behave like a fixed charge.

Thus, the transistor including the oxide semiconductor film with a high impurity concentration and a high density of defect states has unstable electrical characteristics in some cases.

Further, in a transistor using the CAAC-OS film, change in electric characteristics due to irradiation with visible light or ultraviolet light is small.

Next, a microcrystalline oxide semiconductor film will be described.

In an image obtained with a TEM, for example, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm, for example. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a boundary between crystal parts is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a probe diameter larger than that of a crystal part, a peak which shows a crystal plane does not appear. Further, a halo pattern is shown in a selected-area electron diffraction image of the nc-OS film obtained by using an electron beam having a probe diameter (e.g., larger than or equal to 50 nm) larger than that of a crystal part. Meanwhile, spots are shown in a nanobeam electron diffraction image of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction image of the nc-OS film, regions with high luminance in a circular (ring) pattern are shown in some cases. Also in a nanobeam electron diffraction image of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

Nitrogen may be substituted for part of constituent oxygen of the oxide semiconductor film.

In an oxide semiconductor film having a crystal part as the CAAC-OS film, defects in the bulk can be further reduced and when a formation surface flatness is improved, carrier mobility higher than that of an oxide semiconductor in an amorphous state can be obtained. In order to improve the surface flatness, the oxide semiconductor film is preferably formed on a flat surface. Specifically, the oxide semiconductor film is preferably formed on a surface with an average surface roughness (Ra) of less than or equal to 1 nm, preferably less than or equal to 0.3 nm, more preferably less than or equal to 0.1 nm.

Note that in this specification and the like, average surface roughness (Ra) is obtained by expanding arithmetic mean surface roughness, which is defined by JIS B 0601:2001 (ISO4287:1997), into three dimensions so as to be applied to a curved surface, and is an average value of the absolute values of deviations from a reference surface to a specific surface.

In order to increase the flatness of the formation surface of the oxide semiconductor film, planarization treatment is preferably performed on the gate insulating film 316. As the planarization treatment, polishing treatment, dry etching treatment, or plasma treatment can be used. As the planarization treatment, polishing treatment, dry etching treatment, or plasma treatment may be performed plural times, or these treatments may be performed in combination. In the case where the treatments are performed in combination, the order of steps is not particularly limited and may be determined as appropriate depending on the roughness of the surface of the gate insulating film 316.

Oxygen addition treatment may be performed after the oxide semiconductor film is formed. The oxygen addition treatment on the oxide semiconductor film can be performed in a manner similar to the oxygen addition treatment on the gate insulating film 316. Oxygen is added after the oxide semiconductor film is formed, whereby oxygen vacancies in the oxide semiconductor can be reduced.

Figure 13:
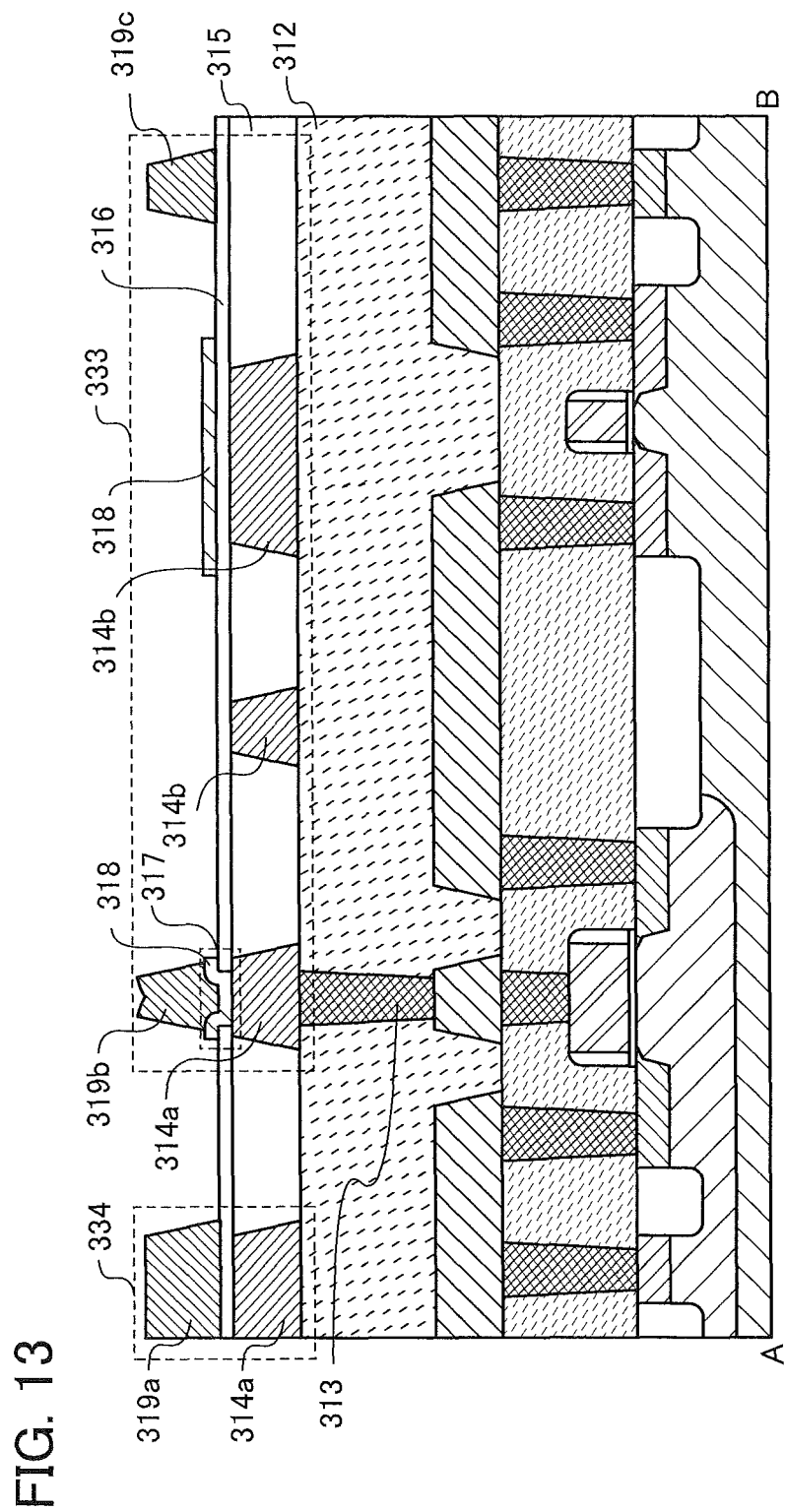
FIG. 13 is a cross-sectional view illustrating a method for manufacturing a semiconductor device.

Note that although the oxide semiconductor film with a single-layer structure is formed in FIG. 10B and FIG. 13, an oxide semiconductor film with a stacked-layer structure may be formed. For example, the oxide semiconductor film may have a stacked-layer structure of a first oxide semiconductor film and a second oxide semiconductor film that are formed using metal oxides with different compositions. For example, the first oxide semiconductor film may be formed using a metal oxide of three metal elements, and the second oxide semiconductor film may be formed using a metal oxide of two metal elements. Alternatively, for example, both the first oxide semiconductor film and the second oxide semiconductor film may be formed using a metal oxide of three metal elements.

Further, the constituent element of the first oxide semiconductor film may be the same as that of the second oxide semiconductor film and the composition of the constituent element of the first oxide semiconductor film may be different from that of the second oxide semiconductor film. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

In this case, in one of the first oxide semiconductor film and the second oxide semiconductor film, which is closer to the wiring layer 314b, i.e., which is positioned on the channel side, the In content is preferably larger than the Ga content. The other which is farther from the wiring layer 314b, i.e., which is on a back channel side, preferably has a composition of In≤Ga.

In an oxide semiconductor, the s orbital of heavy metal mainly contributes to carrier transfer, and overlap of the s orbitals is likely to increase when the In content in the oxide semiconductor is increased. Therefore, an oxide having a composition of In>Ga has higher mobility than an oxide having a composition of In≤Ga. Further, the formation energy of oxygen vacancy is larger and thus oxygen vacancy is less likely to occur in Ga than in In; thus, the oxide having a composition of In≤Ga has more stable characteristics than the oxide having a composition of In>Ga.

An oxide semiconductor having a composition of In>Ga is used on the channel side, and an oxide semiconductor having a composition of In≤Ga is used on the back channel side, so that mobility and reliability of a transistor can be further improved.

Further, oxide semiconductors having different crystallinities may be used for the first oxide semiconductor film and the second oxide semiconductor film. That is, the oxide semiconductor layer may be formed using any of a single crystal oxide semiconductor, a polycrystalline oxide semiconductor, an amorphous oxide semiconductor, and a CAAC-OS, as appropriate. When an amorphous oxide semiconductor is used for at least one of the first oxide semiconductor film and the second oxide semiconductor film, internal stress or external stress of the oxide semiconductor film is relieved, a variation in characteristics among transistors is reduced, and reliability of the transistors can be further improved.

On the other hand, an amorphous oxide semiconductor is likely to absorb impurities such as hydrogen and is likely to generate an oxygen vacancy, and thus easily becomes n-type. Thus, the oxide semiconductor film on the channel side is preferably formed using a crystalline oxide semiconductor such as a CAAC-OS.

Further, the oxide semiconductor film may have a stacked-layer structure including three or more layers in which an amorphous oxide semiconductor film is interposed between a plurality of crystalline oxide semiconductor films. Furthermore, a structure in which an oxide semiconductor film having a crystallinity and an amorphous oxide semiconductor film are alternately stacked may be employed.

These stacked-layer structures of the oxide semiconductor film can be combined as appropriate.

In the case of the oxide semiconductor film has a stacked-layer structure, oxygen addition treatment may be performed each time the oxide semiconductor film is formed. The oxygen addition treatment can be performed in a manner similar to the oxygen addition treatment on the gate insulating film 316. Oxygen is added each time the oxide semiconductor film is formed, whereby an effect of reducing oxygen vacancies in the oxide semiconductor can be improved.

Further, the concentration of hydrogen or water contained in the oxide semiconductor film is preferably as low as possible. This is because if the concentration of hydrogen is high, by a bond of hydrogen and an element contained in an oxide semiconductor, electrons serving as carriers are generated in some cases.

Therefore, in order that the oxide semiconductor film contain hydrogen or water as little as possible in a step of forming the oxide semiconductor film, it is preferable to preheat the substrate provided with the gate insulating film 316 in a preheating chamber of a sputtering apparatus as pretreatment for formation of the oxide semiconductor film so that impurities such as hydrogen or water adsorbed onto the substrate and the gate insulating film 316 are eliminated and removed. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. For example, the remaining moisture can be efficiently evacuated particularly by using a cryopump or a cold trap, thereby reducing the concentration of impurities in the oxide semiconductor film formed in the deposition chamber.

In addition, the oxide semiconductor film is preferably deposited under a condition such that much oxygen is contained (for example, by a sputtering method in an atmosphere where the proportion of oxygen is 30% to 100%) so as to be a film including a region containing much oxygen (preferably containing excessive oxygen as compared to the stoichiometric composition ratio of the oxide semiconductor in a crystalline state).

A high-purity gas from which impurities are removed is preferably used as a gas used for forming the oxide semiconductor film.

The substrate is held in a film formation chamber kept under reduced pressure. Then, the oxide semiconductor film is deposited over the substrate at temperatures from 130° C. to 700° C. by using a gas containing less impurities and an oxide semiconductor target while moisture remaining in the deposition chamber is removed. In particular, with use of a cryopump or a cold trap as an exhaustion unit provided in the preheating chamber, remaining moisture is efficiently removed, for example, so that the concentration of impurities in the oxide semiconductor film deposited in the deposition chamber can be reduced.

Here, heat treatment for removing water or hydrogen contained in the oxide semiconductor film may be performed. The temperature of the heat treatment is higher than or equal to 300° C. and lower than or equal to 700° C., or lower than the strain point of the substrate. The heat treatment can be performed under reduced pressure, or in an oxygen atmosphere, a nitrogen atmosphere, or the like. Note that an oxygen atmosphere can be replaced with a broader term, an oxidizing gas atmosphere. For example, an atmosphere which contains an oxidation gas including oxygen, dinitrogen monoxide, and ozone; or ultra dry air (the moisture amount is less than or equal to 20 ppm (−55° C. by conversion into a dew point), preferably less than or equal to 1 ppm, or further preferably less than or equal to 10 ppb, in the case where measurement is performed with use of a dew point meter of a cavity ring down laser spectroscopy (CRDS) system) may be used.

In this embodiment, with the use of an electric furnace, which is one of heat treatment apparatuses, the oxide semiconductor film is subjected to heat treatment at 450° C. for 1 hour in a nitrogen atmosphere and then subjected to heat treatment at 450° C. for 1 hour in an atmosphere containing nitrogen and oxygen.

Further, the heat treatment apparatus is not limited to an electric furnace, and a device for heating an object to be processed by heat conduction or heat radiation from a heating element such as a resistance heating element may be used. For example, an RTA apparatus such as an LRTA apparatus or a GRTA apparatus can be used. For example, as the heat treatment, GRTA may be performed as follows. The substrate is put in an inert gas heated at high temperature of 650° C. to 700° C., is heated for several minutes, and is taken out of the inert gas.

Note that in the heat treatment, it is preferable that water, hydrogen, and the like be not contained in nitrogen, oxygen, or a rare gas such as helium, neon, or argon. The purity of gas which is introduced into the heat treatment apparatus is preferably set to be higher than or equal to 6N (99.9999%), further preferably higher than or equal to 7N (99.99999%) (that is, the impurity concentration is lower than or equal to 1 ppm, preferably lower than or equal to 0.1 ppm).

Further, after heat treatment under reduced pressure or in an inert atmosphere, the oxide semiconductor film may be heated in an oxygen atmosphere. In the case where in addition to removal of impurities in the oxide semiconductor film, oxygen vacancies are caused by the heat treatment performed under reduced pressure or in an inert atmosphere, such oxygen vacancies in the oxide semiconductor film can be reduced by heat treatment performed later in an oxygen atmosphere.

The heat treatment for dehydration or dehydrogenation may be performed before or after the oxide semiconductor film is processed into an island shape. The heat treatment for dehydration or dehydrogenation may be performed more than once, and may also serve as another heat treatment. By performing heat treatment on the oxide semiconductor film, the crystallinity in the oxide semiconductor film can be increased.

When the heat treatment for dehydration or dehydrogenation is performed before the oxide semiconductor film is processed into an island shape, i.e., when the heat treatment for dehydration or dehydrogenation is performed in the state where the gate insulating film 316 is covered with the oxide semiconductor film, oxygen contained in the gate insulating film 316 can be prevented from being released to the outside by the heat treatment.

In a photolithography process, a resist mask is formed over the oxide semiconductor film and the oxide semiconductor film is selectively etched, so that an island-shaped oxide semiconductor layer 318 is formed. The island-shaped oxide semiconductor layer 318 is in contact with the wiring layer 314a through the opening 317 formed in the gate insulating film 316.

For the etching of the oxide semiconductor film, either dry etching or wet etching or both of them may be used. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. Further alternatively, the oxide semiconductor film may be etched by a dry etching method using an inductively coupled plasma (ICP) etching method. In etching the oxide semiconductor film, it is preferable that the etching selectivity be set to high so as not to etch the gate insulating film 316 excessively.

Figure 10C:
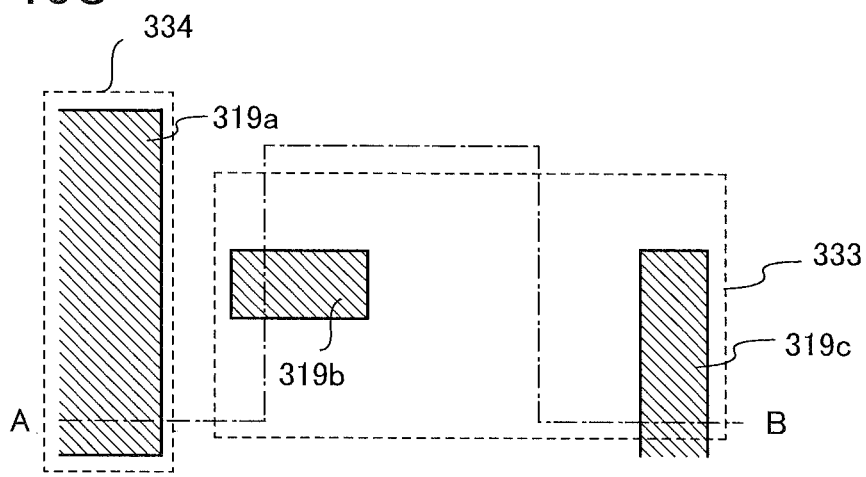

Next, a conductive film is formed over the gate insulating film 316 and the oxide semiconductor layer 318 and is selectively etched, whereby conductive layers 319a to 319c are formed (see FIG. 10C and FIG. 13). Here, the conductive layer 319a serves as the other of the pair of electrodes of the capacitor. The conductive layers 319b and 319c serve as the source electrode layer and the drain electrode layer of the transistor, respectively.

The conductive layer can be formed using a metal material such as molybdenum, titanium, tantalum, tungsten, aluminum, copper, chromium, neodymium, or scandium or an alloy material containing any of these materials as a main component by a sputtering method, a PECVD method, or the like. Further, the conductive layer can be formed using a metal nitride material such as tungsten nitride, tantalum nitride, titanium nitride, or molybdenum nitride. Further alternatively, the conductive layer can be formed using a conductive material such as indium oxide-tin oxide, indium oxide including tungsten oxide, indium zinc oxide including tungsten oxide, indium oxide including titanium oxide, indium tin oxide including titanium oxide, indium oxide-zinc oxide, or indium tin oxide to which silicon oxide is added. Moreover, the conductive layer can have a stacked-layer structure of the above conductive material and the above metal material.

A constituent element in the conductive layers 319a to 319c, an element in the treatment chamber, and a constituent element of an etching gas used for the etching are attached as impurities to the surface of the oxide semiconductor film which are exposed due to the formation of the conductive layers 319a to 319c in some cases. Such attachment of the impurities tends to bring an increase in off-state current of the transistor or deterioration of the electric characteristics of the transistor. In addition, a parasitic channel is likely to be generated in the oxide semiconductor layer 318, electrodes which should be electrically isolated might be electrically connected through the oxide semiconductor layer 318.

Thus, after the etching for forming the conductive layers 319a to 319c is finished, cleaning treatment for removing the impurities attached on the surface and side surface of the oxide semiconductor layer 318 (impurity-removing treatment) may be performed.

The impurity-removing treatment can be performed by plasma treatment or treatment using a solution. As the plasma treatment, oxygen plasma treatment, dinitrogen monoxide plasma treatment, or the like can be used. In addition, a rare gas (typically argon) may be used in the plasma treatment.

Further, for the cleaning treatment using a solution, an alkaline solution such as a TMAH solution, water, or an acidic solution such as diluted hydrofluoric acid can be used. For example, in the case where a diluted hydrofluoric acid solution is used, 50 wt % hydrofluoric acid is diluted with water 100 times to 100000 times, preferably 1000 times to 100000 times. That is, diluted hydrofluoric acid having a concentration of $5\times10^{-4}$ wt % to 0.5 wt %, preferably $5\times10^{-4}$ wt % to $5\times10^{-2}$ wt %, is used for the cleaning treatment. By the cleaning treatment, the above-described impurities attached to the exposed surface of the oxide semiconductor layer 318 can be removed.

Further, by the impurity-removing treatment using a diluted hydrofluoric acid solution, the exposed surface of the oxide semiconductor layer 318 can be etched. That is, impurities attached to the exposed surface of the oxide semiconductor layer 318 or impurities entering the vicinity of the surface of the oxide semiconductor layer 318 can be removed together with part of the oxide semiconductor film.

By performing the impurity removal treatment, the chlorine concentration at the surface of the oxide semiconductor film can be reduced to $1\times10^{19}/cm^3$ or lower (preferably $5\times10^{18}/cm^3$ or lower, more preferably $1\times10^{18}/cm^3$ or lower) in a concentration peak obtained by SIMS. The boron concentration can be reduced to be lower than or equal to $1\times10^{19}/cm^3$ (preferably lower than or equal to $5\times10^{18}/cm^3$, further preferably lower than or equal to $1\times10^{18}/cm^3$). The aluminum concentration can be reduced to be lower than or equal to $1\times10^{19}/cm^3$ (preferably lower than or equal to $5\times10^{18}/cm^3$, more preferably lower than or equal to $1\times10^{18}/cm^3$).

Next, the insulating film 320 is formed so as to cover the components formed in the above steps. The insulating film 320 serves as an interlayer insulating film (a protective film, a planarization insulating film).

The insulating film 320 can be formed using a silicon oxide, a gallium oxide, an aluminum oxide, an aluminum oxynitride, a silicon oxynitride, a silicon nitride oxide, a silicon nitride, or the like by a CVD method or a sputtering method. The insulating film 320 can have a single-layer structure or a stacked-layer structure. After the insulating film 320 is formed, heat treatment may be performed, for example, at 300° C. for 1 hour in a nitrogen atmosphere.

Further, after the insulating film 320 is formed, oxygen addition treatment may be performed on the oxide semiconductor layer 318 with the insulating film 320 provided therebetween. The oxygen addition treatment on the oxide semiconductor layer 318 can be performed in a manner similar to the oxygen addition treatment on the gate insulating film 316.

Finally, a conductive film is formed over the insulating film 320 and is selectively etched, whereby a conductive layer 321 is formed. The conductive layer 321 serves as the gate electrode layer (backgate) of the transistor.

Through the above steps, the transistor 333 and the capacitor 334 can be formed. The transistor 333 and the capacitor 334 correspond to the transistor 101 and the capacitor 104, respectively, which are described in the above embodiment.

Figure 14:
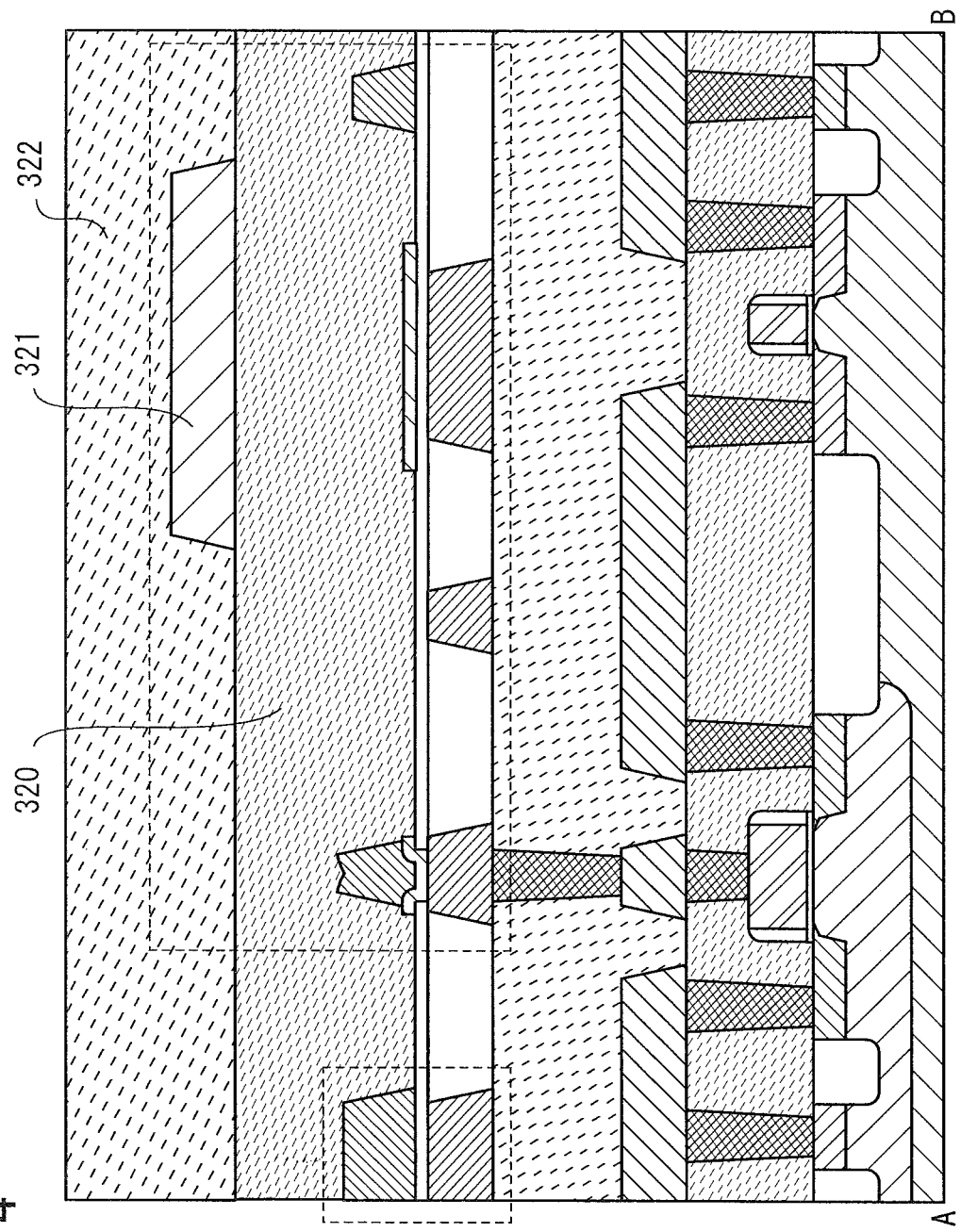
FIG. 14 is a cross-sectional view illustrating a method for manufacturing a semiconductor device.

Next, an insulating film 322 serving as a planarization insulating film is formed, so that surface roughness due to the transistor 333 and the capacitor 334 can be reduced (see FIG. 14). As the planarization insulating film, an organic material such as a polyimide resin, an acrylic resin, or a benzocyclobutene resin can be used. Other than such organic materials, it is also possible to use a low-dielectric constant material (a low-k material) or the like. Note that the planarization insulating film may be formed by stacking a plurality of insulating films formed from these materials. For example, a 1.5-μm-thick acrylic resin film is formed as the planarization insulating film. The acrylic resin film can be formed in such a manner that an acrylic resin is applied by a coating method and then baked (e.g., at 250° C. for 1 hour in a nitrogen atmosphere).

A base film below the oxide semiconductor layer 318, a protective insulating film over the oxide semiconductor layer 318, or a gate insulating film is preferably formed using a material that has a high barrier property against an alkali metal, hydrogen, and oxygen. For example, a silicon nitride film, a silicon nitride oxide film, an aluminum nitride film, an aluminum oxide film, an aluminum oxynitride film, an aluminum nitride oxide film, or the like can be used as the insulating film having a high barrier property. As the base film and the protective insulating film, a single layer or a stacked layer of the insulating film having a high barrier property, or a stacked layer of the insulating film having a high barrier property and the insulating film having a low barrier property may be used. For example, when the gate insulating film 316 is a stacked layer, an insulating film from which oxygen is eliminated is preferably used as an insulating film in contact with the oxide semiconductor layer 318; an insulating film having a high barrier property is preferably used as an insulating film on the wiring layer 314b side. Also in the case where the insulating film 320 is a stacked layer, an insulating film from which oxygen is eliminated is preferably used as the insulating film in contact with the oxide semiconductor layer 318; an insulating film having a high barrier property is preferably used as an insulating film on the conductive layer 321 side.

Covering the oxide semiconductor layer 318 with an insulating film having a high barrier property can prevent entry of impurities from the outside and can also prevent oxygen from releasing from the oxide semiconductor layer 318. In addition, an insulating film from which oxygen is eliminated is provided as the insulating film in contact with the oxide semiconductor layer 318, and an insulating film having a high barrier property is provided so as to surround the oxide semiconductor layer 318 and the insulating film from which oxygen is eliminated; thus, out-diffusion of oxygen eliminated from the insulating film from which oxygen is eliminated can be suppressed and oxygen can be supplied efficiently to the oxide semiconductor layer 318. As a result, change in the threshold voltage of the transistor 333 can be suppressed, and accordingly, reliability of the transistor 333 can be improved.

In this embodiment, the channel length of the n-channel transistor 331 is twice the channel length of the p-channel transistor 332. Thus, the transistor 333 which is formed over the transistors 331 and 332 can be electrically connected to the gate electrode layer 305 of the n-channel transistor 331.

According to the method for manufacturing a memory element of one embodiment of the present invention, the transistor 333 and the capacitor 334 can be formed over the transistors 331 and 332; thus, the area occupied by the memory element can be reduced. Although not shown in FIG. 14, a wiring layer or a transistor including an oxide semiconductor can be further stacked over the insulating film 322. Further, a plurality of multiplexers included in a lookup table can be formed in the layer in which the transistor 331 and 332 are formed.

Figure 15A:
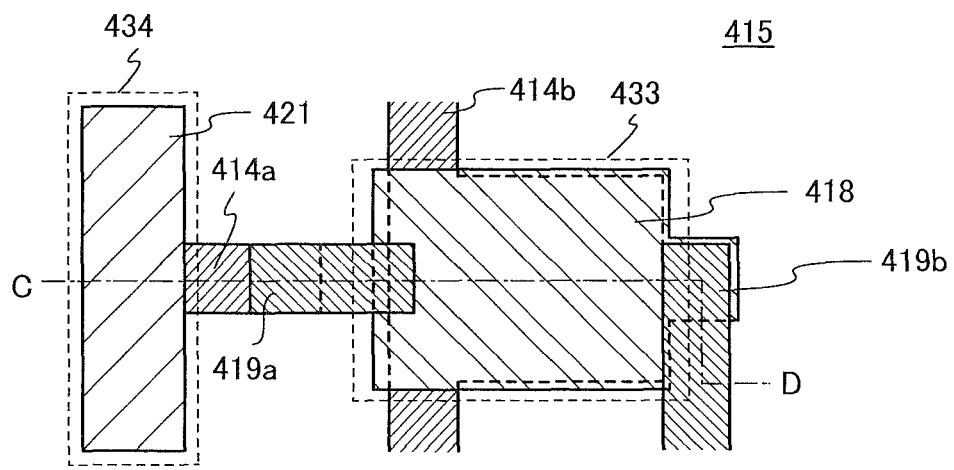
FIGS. 15A and 15B are a plan view and a cross-sectional view of a semiconductor device, respectively.
Figure 15B:
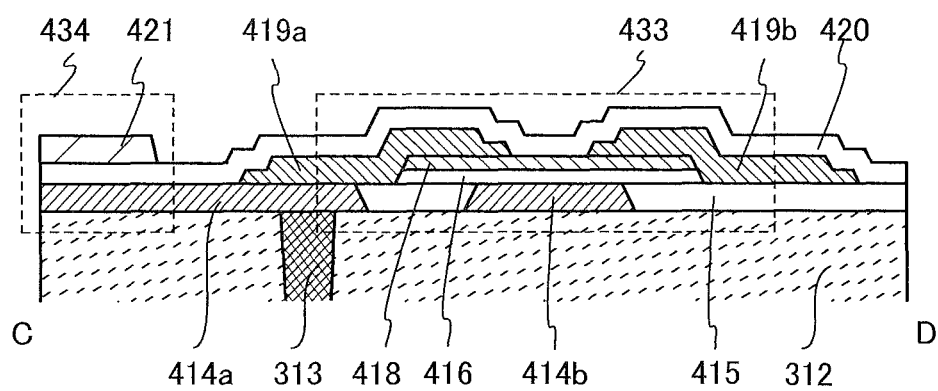

FIGS. 15A and 15B show another mode of the memory element 13.

FIG. 15A is a plan view of a transistor 433 and a capacitor 434 included in the memory element 13. FIG. 15B is a cross-sectional view taken along an alternate long and short dashed line C-D in FIG. 15A. Note that the structures of the transistors 331 and 332, the contact plug 313, and the like are similar to the above-described structures and thus they are omitted in FIGS. 15A and 15B.

The contact plug 313 is provided in the opening in the insulating film 312. Wiring layers 414a and 414b are provided over the insulating film 312. The wiring layers 414a and 414b serve as one of a pair of electrodes of a capacitor and a gate electrode layer, respectively. An insulating layer 415 is provided so as to include the wiring layers 414a and 414b. Note that the description on the wiring layers 314a and 314b, the insulating layer 315, and the like shown in FIG. 10A and FIG. 13 can be referred to for a method for forming the wiring layers 414a and 414b and the insulating layer 415.

An island-shaped gate insulating layer 416 and an island-shaped oxide semiconductor layer 418 are provided over the wiring layers 414a and 414b and the insulating layer 415. The island-shaped gate insulating layer 416 and the island-shaped oxide semiconductor layer 418 can be formed as follows: a gate insulating film and an oxide semiconductor film are deposited and then selectively etched. In addition, the wiring layer 414a and the insulating layer 415 are partly exposed by selectively etching the gate insulating film and the oxide semiconductor film. Note that the description on the gate insulating film 316 and the oxide semiconductor layer 418 shown in FIG. 10B and FIG. 13 can be referred to for a method for forming the gate insulating layer 416 and the oxide semiconductor layer 318.

Conductive layers 419a and 419b are provided over the oxide semiconductor layer 418. The conductive layer 419a is in contact with the wiring layer 414a. The conductive layers 419a and 419b serve as a source electrode layer and a drain electrode layer, respectively.

The conductive layers 419a and 419b are formed as follows: a conductive film is formed so as to cover the oxide semiconductor layer 418 and the like, a resist mask is formed over the conductive film, and selective etching is performed. Then, ashing is performed on the resist mask to reduce the resist mask. Then, the conductive film is etched again using the reduced resist mask, whereby the lower edges of the conductive layers 419a and 419b are outer than the upper edges thereof. For example, in the case of the cross section taken along C-D in FIG. 15B (in the channel length direction), the conductive layers 419a and 419b each having two-level structure in which the lower level is longer than the upper level can be formed.

With the conductive layers 419a and 419b having this structure, the coverage of an insulating film formed over the oxide semiconductor layer 418 and the conductive layers 419a and 419b can be improved. Note that the description on the conductive film used for forming the conductive layers 319a and 319b shown in FIG. 10C and FIG. 13 can be referred to for a method for forming the conductive layers 419a and 419b.

An insulating film 420 is provided over the oxide semiconductor layer 418 and the conductive layers 419a and 419b. The description on the insulating film 320 shown in FIG. 14 can be referred to for the insulating film 420.

A conductive layer 421 is provided over the insulating film 420. The conductive layer 421 serves as the other of the pair of electrodes of the capacitor 434.

Through the above steps, the transistor 433 and the capacitor 434 can be formed.

Note that in FIGS. 15A and 15B, a conductive layer (backgate) may be further provided over the insulating film 420. In this case, the conductive layer serving as a backgate can be formed in the same step for forming the conductive layer 421. In addition, since the lower edges of the conductive layers 419a and 419b are outer than the upper edges thereof and thus the coverage of the insulating film 420 is improved, the coverage of the conductive layer serving as a backgate can be also improved.

According to the method for manufacturing a memory element of one embodiment of the present invention, the transistor 433 and the capacitor 434 can be formed over the transistors 331 and 332; thus, the area occupied by the memory element can be reduced. Although not shown in FIG. 15, a wiring layer or a transistor including an oxide semiconductor can be further stacked over the transistor 433 and the capacitor 434. Further, a plurality of multiplexers included in a lookup table can be formed in the layer in which the transistor 331 and 332 are formed.

This application is based on Japanese Patent Application serial No. 2012-119309 filed with Japan Patent Office on May 25, 2012, the entire contents of which are hereby incorporated by reference.

What is claimed is:

1. A memory element comprising:
   a first transistor whose off-state current per 1 μm of a channel width is 100 zA or less;
   an n-channel transistor;
   a p-channel transistor; and
   a capacitor,
   wherein one of a source and a drain of the first transistor is electrically connected to one of electrodes of the capacitor, a gate of the n-channel transistor, and a gate of the p-channel transistor, wherein one of a source and a drain of the n-channel transistor is electrically connected to one of a source and a drain of the p-channel transistor, wherein, while the first transistor is in an on-state, a first potential is supplied to the other of the electrodes of the capacitor and a second potential is supplied to the one of the electrodes of the capacitor, or a third potential is supplied to the other of the electrodes of the capacitor and a fourth potential is supplied to the one of the electrodes of the capacitor, wherein, while the first transistor is in an off-state after the first potential is supplied to the other of the electrodes of the capacitor, a potential supplied to the other of the electrodes of the capacitor is made higher than the first potential, and wherein the first potential is lower than the third potential, and the second potential is higher than the fourth potential.

2. The memory element according to claim 1, wherein a channel length of the n-channel transistor is twice or more a channel length of the p-channel transistor.

3. The memory element according to claim 1, further comprising:
an input terminal electrically connected to the other of the source and the drain of the p-channel transistor; and
an output terminal electrically connected to the one of the source and the drain of the n-channel transistor and the one of the source and the drain of the p-channel transistor.

4. The memory element according to claim 1, wherein the first transistor includes an oxide semiconductor in a channel formation region.

5. A method for driving a semiconductor device comprising a first transistor, a second transistor, a third transistor, and a capacitor, wherein one of a source and a drain of the first transistor is electrically connected to a first electrode of the capacitor, a gate of the second transistor, and a gate of the third transistor, wherein one of a source and a drain of the second transistor is electrically connected to one of a source and a drain of the third transistor, and wherein each of the second transistor and the third transistor has a different conductivity type, the method comprising:
supplying a first potential to a second electrode of the capacitor and a second potential to the first electrode of the capacitor or supplying a third potential to the second electrode of the capacitor and a fourth potential to the first electrode of the capacitor, while the first transistor is in an on-state;
turning off the first transistor; and
making a potential supplied to the second electrode of the capacitor higher than the first potential while the first transistor is in an off-state after the first potential is supplied to the second electrode of the capacitor,
wherein the first potential is lower than the third potential and the second potential is higher than the fourth potential.

6. The method according to claim 5, wherein a potential of the first electrode of the capacitor becomes a potential at which the second transistor is turned on by a capacitive coupling with the second electrode of the capacitor after supplying the second potential to the second electrode of the capacitor.

7. The method according to claim 5, wherein a maximum value of a potential difference between the gate of the second transistor and the other of the source and the drain of the third transistor is larger than a potential difference between the other of the source and the drain of the second transistor and the other of the source and the drain of the third transistor.

8. The method according to claim 5, wherein an off-state current per 1 μm of a channel width of the first transistor is 100 zA or less.

9. The method according to claim 5, wherein a channel length of the second transistor is twice or more a channel length of the third transistor.

10. The method according to claim 5, wherein the first transistor includes an oxide semiconductor in a channel formation region.

11. A method for driving a semiconductor device comprising a first transistor, a second transistor, a third transistor, and a capacitor, wherein one of a source and a drain of the first transistor is electrically connected to a first electrode of the capacitor, a gate of the second transistor, and a gate of the third transistor, wherein one of a source and a drain of the second transistor is electrically connected to one of a source and a drain of the third transistor, wherein the second transistor is an n-channel transistor, and wherein the third transistor is a p-channel transistor, the method comprising:
supplying a first potential to a second electrode of the capacitor and a second potential to the first electrode of the capacitor or supplying a third potential to the second electrode of the capacitor and a fourth potential to the first electrode of the capacitor, while the first transistor is in an on-state;
turning off the first transistor; and
making a potential supplied to the second electrode of the capacitor higher than the first potential while the first transistor is in an off-state after the first potential is supplied to the second electrode of the capacitor,
wherein the first potential is lower than the third potential and the second potential is higher than the fourth potential.

12. The method according to claim 11, wherein a potential of the first electrode of the capacitor becomes a potential at which the second transistor is turned on by a capacitive coupling with the second electrode of the capacitor after supplying the second potential to the second electrode of the capacitor.

13. The method according to claim 11, wherein a maximum value of a potential difference between the gate of the third transistor and the other of the source and the drain of the second transistor is larger than a potential difference between the other of the source and the drain of the third transistor and the other of the source and the drain of the second transistor.

14. The method according to claim 11, wherein an off-state current per 1 μm of a channel width of the first transistor is 100 zA or less.

15. The method according to claim 11, wherein a channel length of the second transistor is twice or more a channel length of the third transistor.

16. The method according to claim 11, wherein the first transistor includes an oxide semiconductor in a channel formation region.

* * * * *